(12) United States Patent
Shimizu et al.

(10) Patent No.: US 8,552,537 B2
(45) Date of Patent: Oct. 8, 2013

(54) SEMICONDUCTOR DEVICE AND METHOD FOR FABRICATING THE SAME

(75) Inventors: Tatsuo Shimizu, Tokyo (JP); Satoshi Itoh, Ibaraki (JP); Hideyuki Nishizawa, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 120 days.

(21) Appl. No.: 13/215,626

(22) Filed: Aug. 23, 2011

(65) Prior Publication Data

US 2012/0228694 A1 Sep. 13, 2012

(30) Foreign Application Priority Data

Mar. 11, 2011 (JP) ................................. 2011-054855

(51) Int. Cl.
| | | |
|---|---|---|
| H01L 23/58 | (2006.01) | |
| H01L 21/8238 | (2006.01) | |
| H01L 21/336 | (2006.01) | |
| H01L 21/20 | (2006.01) | |
| H01L 21/3205 | (2006.01) | |
| G11C 11/34 | (2006.01) | |

(52) U.S. Cl.
USPC ........... 257/635; 257/632; 257/636; 257/637; 257/638; 257/639; 257/640; 257/641; 257/E21.18; 257/E27.103; 257/E29.309; 257/E21.09; 257/E21.645; 257/E29.255; 365/185.17; 438/211; 438/479; 438/591; 438/264

(58) Field of Classification Search
USPC ........... 438/211, 479, 591, 264; 257/E21.18, 257/E27.103, E29.309, E21.09, E21.645, 257/E29.255, 629–652; 365/185.17
See application file for complete search history.

(56) References Cited

U.S. PATENT DOCUMENTS

| | | | |
|---|---|---|---|
| 2004/0266211 A1* | 12/2004 | Tao et al. | 438/758 |
| 2005/0266638 A1* | 12/2005 | Cho et al. | 438/257 |
| 2007/0090443 A1* | 4/2007 | Choi et al. | 257/314 |
| 2009/0221140 A1* | 9/2009 | Lim et al. | 438/591 |

FOREIGN PATENT DOCUMENTS

| | | |
|---|---|---|
| JP | 5-74762 | 3/1993 |
| JP | 2001-77112 | 3/2001 |
| JP | 2009-181977 | 8/2009 |
| WO | WO 2008/059768 A1 | 5/2008 |

OTHER PUBLICATIONS

Yoshifumi Nishi, et al., "NiSi metal S/D transistors with ultimately low Schottky barrier by sulfur implantation after silicidation process", Extended Abstracts of the 2009 International Conference on Solid State Devices and Materials, Sendai, 2009, pp. 771-772.
Notification of Reason(s) for Refusal issued Feb. 5, 2013 in Japanese Patent Application No. 2011-054855 (with English translation).

* cited by examiner

Primary Examiner — Chuong A Luu
Assistant Examiner — Cory Eskridge
(74) Attorney, Agent, or Firm — Oblon, Spivak, McClelland, Maier & Neustadt, L.L.P.

(57) ABSTRACT

A semiconductor device according to an embodiment, includes a dielectric film and an Si semiconductor part. The dielectric film is formed by using one of oxide, nitride and oxynitride. The Si semiconductor part is arranged below the dielectric film, having at least one element of sulfur (S), selenium (Se), and tellurium (Te) present in an interface with the dielectric film, and formed by using silicon (Si).

7 Claims, 17 Drawing Sheets

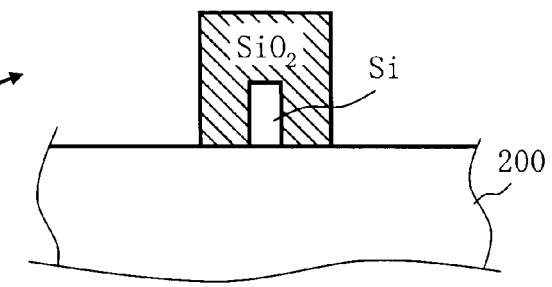
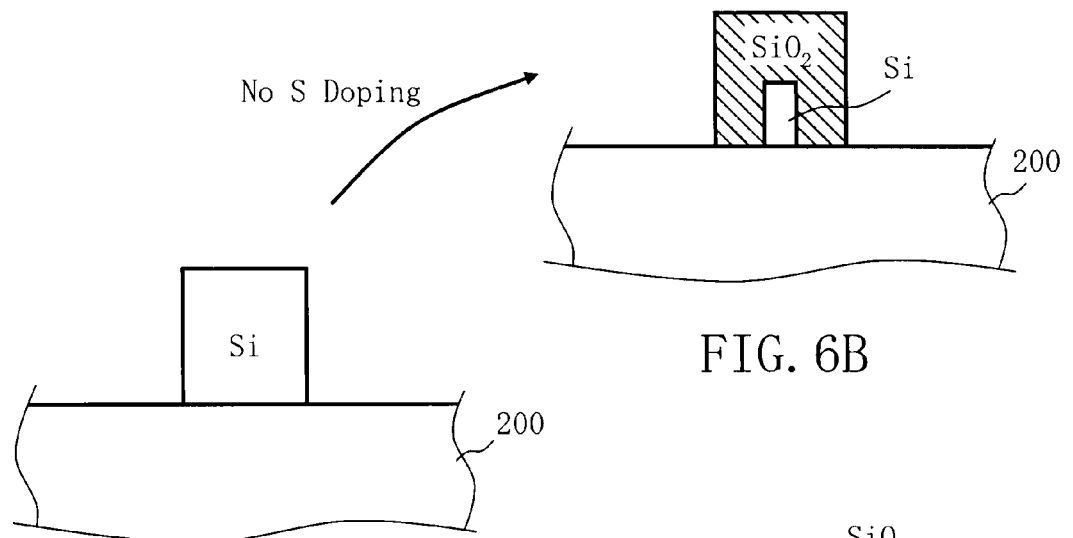
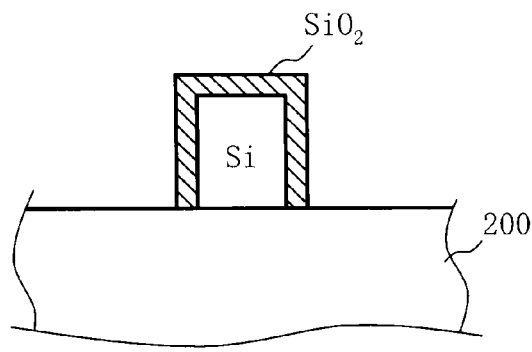
FIG. 6A
FIG. 6B
FIG. 6C

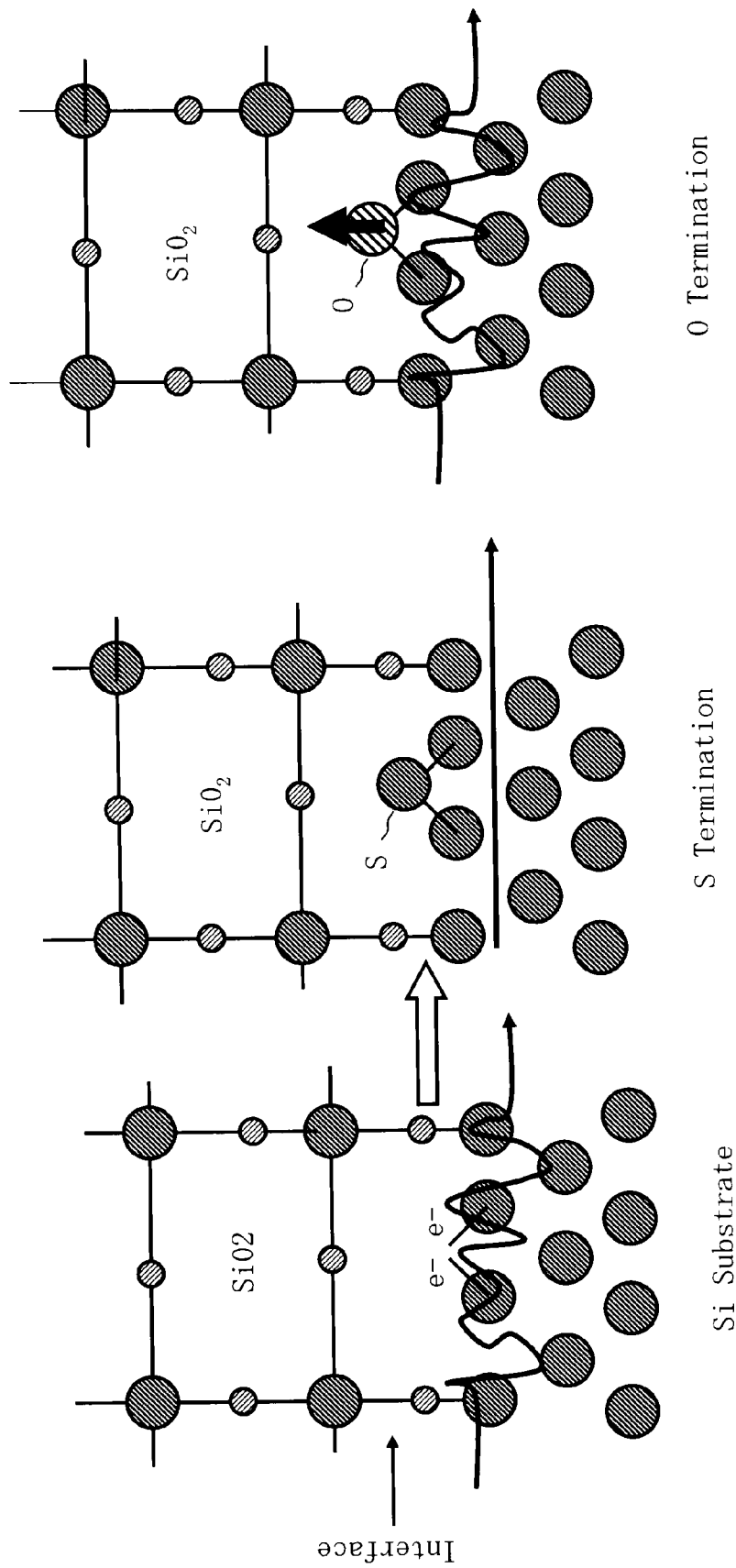

SEMICONDUCTOR DEVICE AND METHOD FOR FABRICATING THE SAME

CROSS-REFERENCE TO RELATED APPLICATION

This application is based upon and claims the benefit of priority from Japanese Patent Application No. 2011-054855 filed on Mar. 11, 2011 in Japan, the entire contents of which are incorporated herein by reference.

FIELD

Embodiments described herein relate to a semiconductor device and a method for fabricating a semiconductor device.

BACKGROUND

When, for example, a MOSFET (Metal Oxide Semiconductor Field Effect Transistor) using semiconductor silicon (Si) is produced, FGA (Forming Gas Anneal) may be performed to terminate an interface state between the semiconductor Si and a dielectric film.

However, if an MOSFET interface is formed by performing the FGA for interface termination with hydrogen (H), the H termination interacts with charges flowing through a channel, absorbing energy as optical phonons. Accordingly, a problem such as reduced mobility is caused. Moreover, a problem of the H termination being disconnected is caused with an increasing vibration of optical phonons. Further, the H termination is vulnerable to H attacks from outside, easily changing to $H_2$. Thus, H of the termination of Si is detached. If the H termination is disconnected, a dangling bond becomes a charge trap, causing a problem of variable threshold voltage or reduced mobility.

Regarding the relationship between the Si semiconductor and the dielectric film, a problem is caused when an Si nano-wire is formed. An Si nano-wire can be formed by heating a wire-shaped Si rod in an oxygen atmosphere to form a thermal oxide film from an exposed surface toward the inside thereof. However, with increasing micropatterning, it is becoming increasingly more difficult to control the oxidization of the Si rod. As a result, it is more difficult to control the size of an Si nano-wire.

BRIEF DESCRIPTION OF THE DRAWINGS

FIGS. 6A to 6C are conceptual diagrams illustrating formation states of an oxide film in the first embodiment;

FIGS. 8A to 8C are conceptual diagrams comparing and illustrating ease with which a local spin arises in the first embodiment;

DETAILED DESCRIPTION

A semiconductor device according to an embodiment, includes a dielectric film and an Si semiconductor part. The dielectric film is formed by using one of oxide, nitride and oxynitride. The Si semiconductor part is arranged below the dielectric film, having at least one element of sulfur (S), selenium (Se), and tellurium (Te) present in an interface with the dielectric film, and formed by using silicon (Si).

A semiconductor device according to an embodiment, includes a plurality of silicon (Si) semiconductor parts and a plurality of dielectric films. The plurality of silicon (Si) semiconductor parts is arranged on a substrate, formed in a wire-shaped structure, and in which at least one element of sulfur (S), selenium (Se), and tellurium (Te) is present on a surface portion. The plurality of dielectric films is formed as if to cover a corresponding Si semiconductor part of the plurality of Si semiconductor parts and in contact with a surface portion of the corresponding Si semiconductor part of the plurality of Si semiconductor parts to form an interface with the corresponding Si semiconductor part of the plurality of Si semiconductor parts.

A method for fabricating a semiconductor device according to an embodiment, includes implanting at least one element of sulfur (S), selenium (Se), and tellurium (Te) into a silicon (Si) semiconductor part formed on a substrate; and forming a dielectric film using one of oxide, nitride, and oxynitride on the Si semiconductor part into which the element has been implanted while performing heating treatment process.

First Embodiment

Hereinafter, in embodiments, a semiconductor device having an interface termination structure stronger than the H termination and a method for fabricating the semiconductor device will be described. Also, a semiconductor device enabling control of the size of an Si nano-wire and a method for fabricating the semiconductor device will be described. The first embodiment will be described below with reference to the drawings.

Figure 1A:
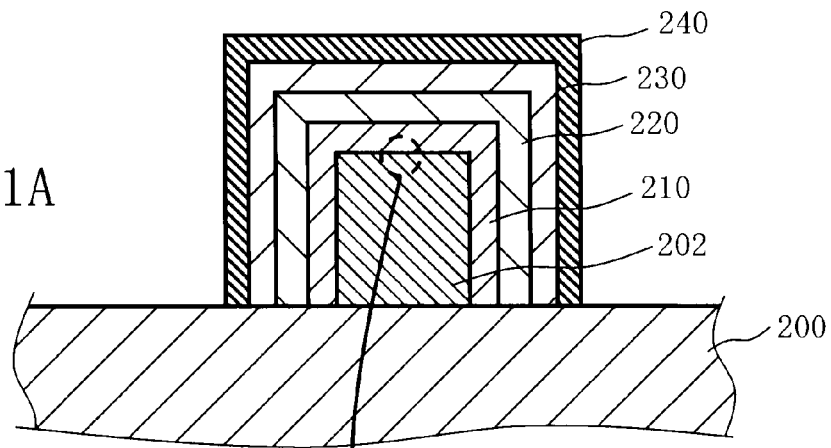
FIGS. 1A and 1B are sectional views showing an example of a configuration of a semiconductor device according to a first embodiment.
Figure 1B:
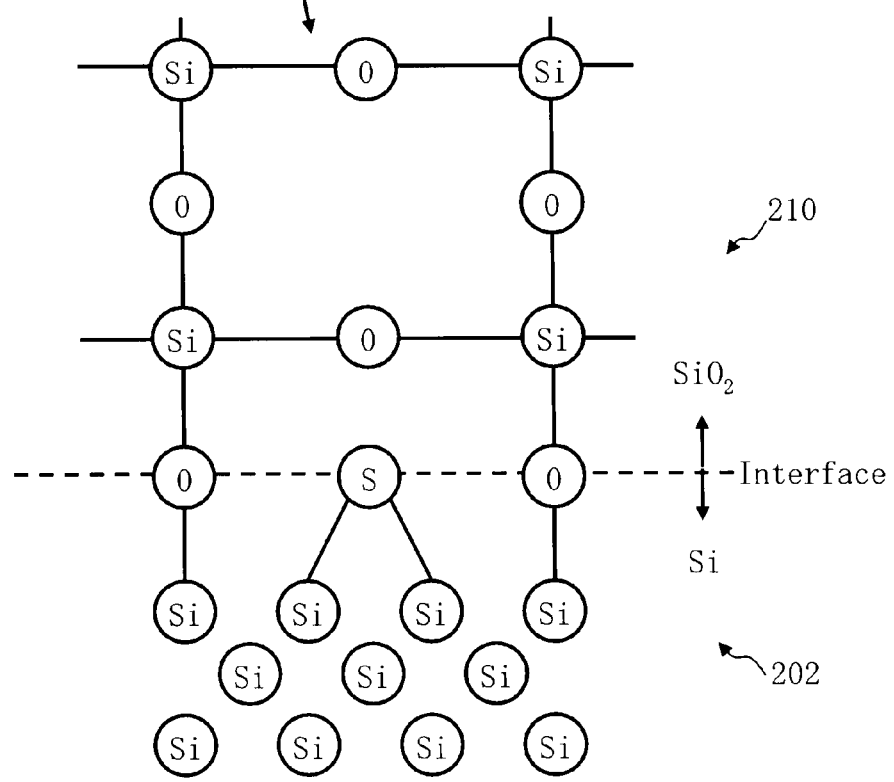

In FIGS. 1A and 1B, sectional views showing an example of the configuration of a semiconductor device according to the first embodiment is shown. In FIG. 1A, as a semiconductor device according to the first embodiment, for example, an example of a memory element by a silicon (Si) nano-wire is shown. Such a semiconductor device has a structure in which a large number of MOSFETs (Metal-Oxide-Semiconductor Field-effect Transistors) are arranged in a column toward the depth of the drawing. This is, for example, a structure called an NAND column or NAND string. Such a semiconductor device is an example of, for example, a NAND-type flash memory.

In FIG. 1A, an Si semiconductor film 202 is formed on an Si semiconductor substrate 200. The Si semiconductor film 202 is formed, for example, in a wire-shaped structure extending toward the depth of the drawing. Then, for example, a structure in which p-type and n-type Si semiconductor regions are alternately arranged toward the depth of the drawing can suitably be adopted. The Si semiconductor film 202 is an example of an Si semiconductor part. For example, the Si semiconductor film 202 whose one side has a size of 10 nm or less is formed.

The Si semiconductor film 202 has a silicon oxide film (SiO$_2$ film) 210 formed therearound, here on the top face and side face thereof. Here, the silicon oxide film 210 is used as an example, but the present embodiment is not limited to this. For example, instead of oxide, nitride or oxynitride may be used. More specifically, instead of the silicon oxide film 210, a silicon nitride film (SiN film) or silicon oxynitride film (SiON film) may be used.

In a semiconductor device according to the first embodiment, at least one element of sulfur (S), selenium (Se), and tellurium (Te) (hereinafter, these elements are sometimes called generically an element A) is caused to be present in an interface (surface portion of the Si semiconductor film 202) between the Si semiconductor film 202 and the silicon oxide film 210. As shown in FIG. 1B, the element A is bonded to dangling bonds of Si in the Si semiconductor film 202 that are not connected to oxygen (O) of the silicon oxide film 210 to terminate in the interface with the silicon oxide film 210. The interface between the Si semiconductor film 202 and the silicon oxide film 210 is thereby stabilized. The silicon oxide film 210 becomes, for example, a tunnel dielectric film. The silicon oxide film 210 is formed to a thickness of, for example, 1 nm.

The silicon oxide film 210 has a Si nitride film (SiN film) 220 formed therearound, here on the top face and side face thereof. The Si nitride film 220 becomes an example of a charge accumulation film. The Si nitride film 220 suitably uses silicon nitride (SiN) in which more Si is contained than the stoichiometric ratio ($Si_3N_4$). The Si nitride film 220 is formed to a thickness of, for example, 0.5 nm.

The Si nitride film 220 has a silicon oxide film (SiO$_2$ film) 230 formed therearound, here on the top face and side face thereof. The silicon oxide film 230 becomes an example of a block film (interelectrode dielectric film). The silicon oxide film 230 is formed to a thickness of, for example, 1 nm.

Then, a polysilicon film 240 is formed around the silicon oxide film 230, here on the top face and side face thereof and in a control electrode (gate electrode) portion. A source/drain portion is covered with a resist and the polysilicon film 240 formed in the control electrode (gate electrode) portion is doped with boron (boron doped polysilicon). The polysilicon film 240 becomes an example of the control electrode. The control electrode has a large effective work function because boron is doped. Accordingly, poor erasing due to a back tunnel can be suppressed.

For example, a p-type Si semiconductor substrate can suitably be used as the Si semiconductor substrate 200. Alternatively, an n-type Si semiconductor substrate may be used. If an n-type Si semiconductor substrate is used, a p-type impurity may be implanted, or "injected" into a portion where a p-type semiconductor region is formed. Though not illustrated, the Si semiconductor substrate 200 has a dielectric film such as an oxide film formed on the surface thereof to insulate the Si semiconductor substrate 200 from the polysilicon film 240. Alternatively, an SOI (Silicon On Insulator) substrate in which an SiO$_2$ film is formed below the Si semiconductor film in advance may also be suitably used as the Si semiconductor substrate 200. Then, the Si semiconductor film in an upper layer of the SOI substrate may suitably be processed to use the Si semiconductor film as the Si semiconductor film 202.

Figure 2:
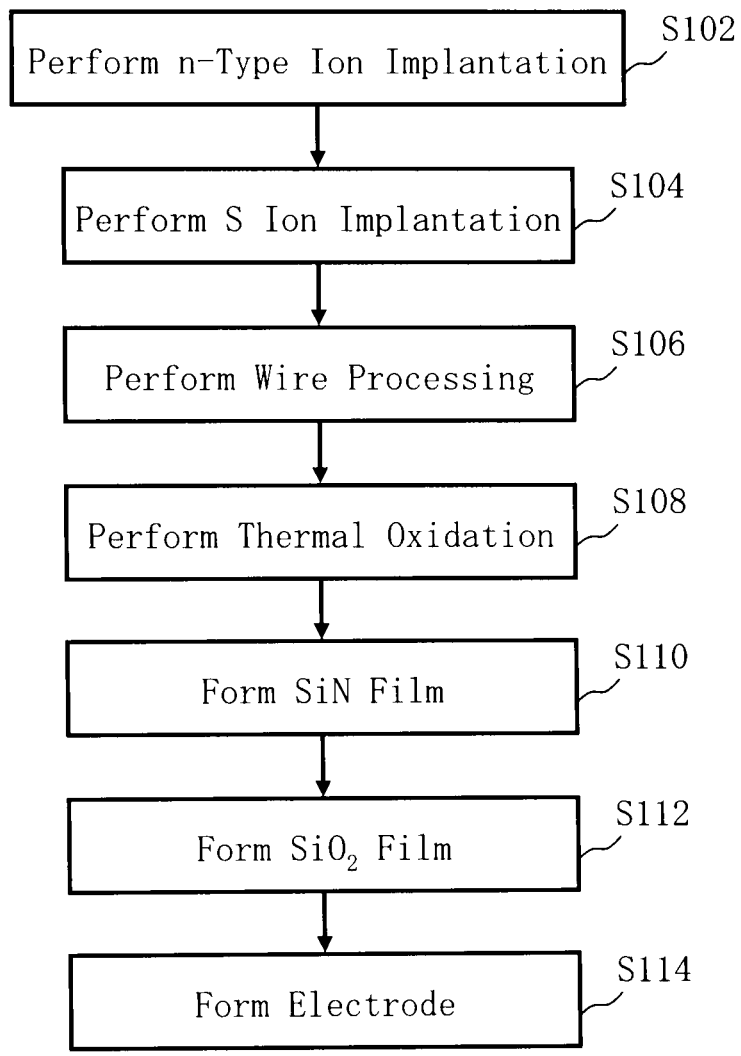
FIG. 2 is a flow chart showing principal processes of a method for fabricating the semiconductor device according to the first embodiment.

A flow chart showing principal processes of the method for fabricating the semiconductor device according to the first embodiment is shown in FIG. 2. In FIG. 2, the method for fabricating the semiconductor device according to the first embodiment executes a series of processes including an n-type ion implantation process (S102), S ion implantation process (S104), wire processing process (S106), thermal oxidation process (S108), Si nitride film formation process (S110), Si oxide film formation process (S112), and electrode formation process (S114).

Figure 3A:
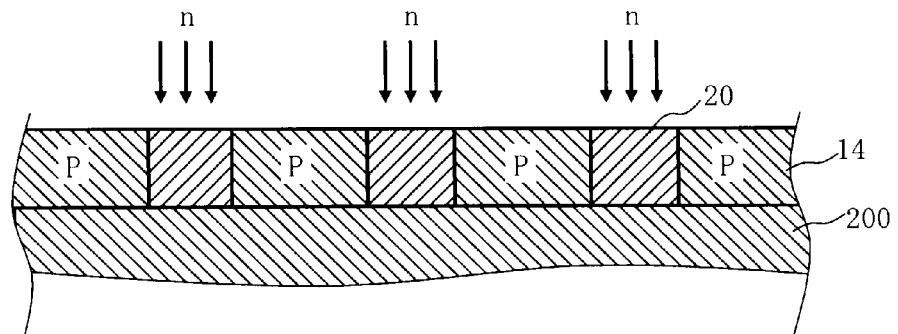
FIGS. 3A and 3B are process sectional views of the method for fabricating the semiconductor device according to the first embodiment.
Figure 3B:
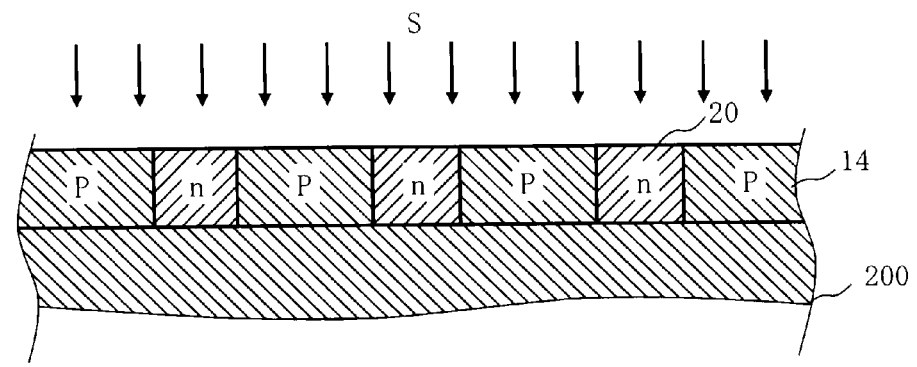

Process sectional views of the method for fabricating the semiconductor device according to the first embodiment are shown in FIGS. 3A and 3B. In FIGS. 3A and 3B, each process from the n-type ion implantation process (S102) to the S ion implantation process (S104) is shown.

In FIG. 3A, as the n-type ion implantation process (S102), an n-type impurity is selectively implanted, or "injected" into a portion of the p-type Si semiconductor substrate 200 to form an n-type semiconductor region 20 in a p-type Si semiconductor region. For example, a line of the n-type semiconductor region 20 (n-type semiconductor part) is formed in a p-type semiconductor region with the line width of 20 nm. An Si semiconductor whose crystal orientation is (001) is used for the top face of the Si semiconductor substrate 200. If an n-type Si semiconductor substrate is used, conversely a p-type impurity may be selectively implanted into a portion of the substrate to form a p-type semiconductor region in an n-type Si semiconductor region.

In FIG. 3B, as the S ion implantation process (S104), S ions are implanted, or "injected" from the entire surface of the Si semiconductor substrate having a line structure in which a p-type semiconductor region 14 and the n-type semiconductor region 20 are alternately arranged. The element to be implanted is not limited to S. As described above, at least one element A from S, Se, and Te can be used.

The element A will be caused to be present in the interface between the Si semiconductor film 202 and the silicon oxide film 210 described above. Then, the element A is caused to perform interface termination of Si. Thus, the amount necessary for interface termination will first be described.

(Amount Necessary for Interface Termination)

The necessary amount of S, Se, or Te in the interface will be considered. First, the upper limit thereof will be considered. The density of dangling bond of the Si (001) plane is $1.4\times10^{15}$ cm$^{-2}$. Two dangling bonds are terminated by one S, Se, or Te and thus, the surface density thereof must be half that, $7.0\times10^{14}$ cm$^{-2}$ or less. In reality, however, bonding of substrate Si and oxygen in SiO$_2$ is also needed and thus, also in terms of strength, the surface density thereof is preferably half that or less when terminated by S. That is, the surface density is preferably $3.5\times10^{14}$ cm$^{-2}$ or less.

Next, the lower limit thereof will be considered. The charge trap density in the interface of MOSFET produced by thermal oxidation and using the Si(001)/SiO$_2$ interface is on the order of $10^9$ cm$^{-2}$ to $10^{12}$ cm$^{-2}$. Thus, the surface density thereof needs to be $1.0\times10^9$ cm$^{-2}$ or more. In Si nano-wire formation by oxidation, an extremely large number of dangling bonds are considered to be formed because of the state in which etching by oxygen may occur at any time. Thus, the surface density thereof is preferably $1.0\times10^{12}$ cm$^{-2}$ or more.

That is, the necessary amount of S, Se, or Te in the interface is suitably $1.0\times10^9$ cm$^{-2}$ or more and $7.0\times10^{14}$ cm$^{-2}$ or less in surface density. Particularly preferably, the surface density thereof is $1.0\times10^{12}$ cm$^{-2}$ or more and $3.5\times10^{14}$ cm$^{-2}$ or less. Such an amount of S, Se, or Te can terminate almost all interfacial dangling bonds.

If S, Se, or Te is implanted, or "injected" into Si and then, as described later, S, Se, or Te is piled up in the interface (aggregated on the top face) later, extra S, Se, or Te does not remain in the Si nano-wire and instead, is diffused outwardly into the gate dielectric film SiO$_2$ or the gate electrode. Thus, these elements will not adversely affect the Si nano-wire itself. Therefore, a sufficiently large amount of S, Se, or Te may be implanted into Si for pile up in the interface. S, Se, or Te is implanted into the depth where an Si nano-wire is produced.

Next, the implantation amount in the S ion implantation process (S104) will be described. If S, Se, or Te is implanted into Si before an Si nano-wire is formed, there is no need to implant such a large amount thereof. An amount thereof that diffuses toward the interface to terminate dangling bonds in the interface suffices.

If the implantation amount (density) is increased like $5\times10^{12}$ cm$^{-3}$, $1\times10^{13}$ cm$^{-3}$, $1\times10^{14}$ cm$^{-3}$, $1\times10^{15}$ cm$^{-3}$, $1\times10^{16}$ cm$^{-3}$, $1\times10^{17}$ cm$^{-3}$, $1\times10^{18}$ cm$^{-3}$, and $1\times10^{19}$ cm$^{-3}$, termination of the interface will be completed earlier, forming a larger Si nano-wire. For each of the implantation amounts, the length of one side (corresponding to the length of a shorter side for a rectangular section) becomes about 0.8 nm, 1.6 nm, 3.2 nm, 6.4 nm, 10 nm, 13 nm, 16 nm, and 19 nm. If, on the other hand, the implantation amount (density) is decreased to less than $1\times10^{12}$ cm$^{-3}$, it is known that, like when nothing is implanted, the Si nano-wire disappears during an oxidation (similarly, nitriding or oxynitriding) process. Thus, the implantation amount of S is suitably $1\times10^{12}$ cm$^{-3}$ or more. Here, for example, the implantation amount is set to $1\times10^{17}$ cm$^{-3}$.

Figures 4A, 4B:
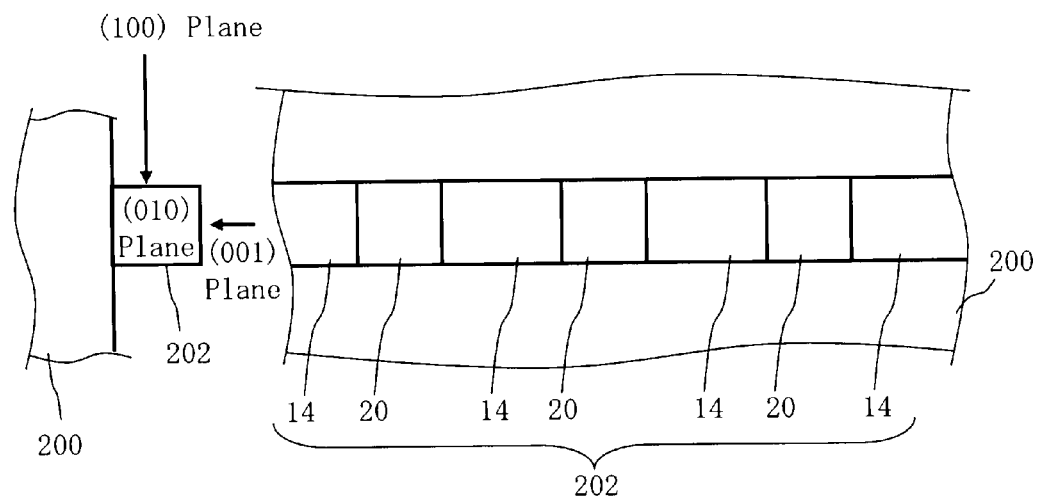
FIGS. 4A and 4B are a process top view and a side view of the method for fabricating the semiconductor device according to the first embodiment.

A process top view and a side view of the method for fabricating the semiconductor device according to the first embodiment are shown in FIGS. 4A and 4B. FIGS. 4A and 4B show the wire processing process (S106). FIG. 4A shows a side view thereof. FIG. 4B shows a top view thereof.

As the wire processing process (S106), the Si semiconductor film 202 in a wire shape is formed in a direction perpendicular to the above n-type line by etching. For example, the width of the wire structure portion (line portion) is set to 30 nm and both sides thereof are dug down to a depth of, for example, 14 nm to form a space portion. Accordingly, as shown in FIG. 4A, the Si semiconductor film 202, which is a convex wire structure portion (Si rod) of a portion of the Si semiconductor substrate 200, is formed. Accordingly, as shown in FIG. 4B, the Si semiconductor film 202 can form a structure in which the p-type Si semiconductor region 14 and the n-type semiconductor region 20 are alternately arranged. In this case, the Si semiconductor film 202 is formed in such a way that, among faces of the Si semiconductor film 202, the crystal orientation of the side face becomes the (100) or (−100) orientation toward the direction in which the wire extends. The Si semiconductor film 202 is also formed in such a way that the top face of the Si semiconductor film 202 becomes the (001) orientation. By using the Si semiconductor substrate 200 whose surface has the (001) crystal orientation, the top face of the Si semiconductor film 202 can be made to have the (001) orientation.

The first principle calculation in the first embodiment is based on the density functional formalism by local density approximation. Si uses a norm-conserving pseudo-potential and S, Se, Te, and O use an ultra-soft pseudo-potential developed by Vanderbilt and others. The first principle calculation is a technique capable of calculating an optimal structure and total energy of a system in the structure. Here, the optimal structure when S, Se, or Te is present in the interface, the degree of stability of the structure, and vibration conditions are determined by calculation.

As described above, the top face of the Si semiconductor film 202 shown in FIG. 4A is formed in the (001) orientation. The side face thereof toward the longitudinal direction (the depth direction of the drawing) is formed in the (100) or (−100) orientation. As shown in FIG. 1B, dangling bonds (DB) of Si are paired in the interface with the silicon oxide film 210 on the (001) plane of the Si semiconductor film 202. The first principle calculation shows that the pair of DB is greatly stabilized by forming a bridge structure with the element such as S, Se, and Te.

By being bonded to two Si atoms in two coordinates, S, Se, or Te can have a closed shell structure and stabilized, which is revealed by calculation. In this case, the structure is very stable and oxidation resistance is increased.

The above can be said of planes equivalent to the Si (001) plane. Thus, if the rod structure of silicon is produced in such a way that the side face direction is the (100) or (−100) direction on an Si (001) substrate and the surface thereof is oxidized, like the (001) plane of the surface, the interface between the (100) or (−100) plane of the side face and the oxide film can be terminated by the element such as S, Se, or Te. However, if the side face is set to the (110) direction or the like, how DB appears changes and it becomes difficult to create a termination structure. While the silicon rod structure is expressed as an Si nano-wire here, a case when the side face is long and top and bottom faces are short is also included and in that case, the silicon rod structure becomes a Fin structure of Si.

Process sectional views of the method for fabricating the semiconductor device according to the first embodiment are shown in FIGS. 5A to 5D. In FIGS. 5A to 5D, each process from the thermal oxidation process (S108) to the electrode formation process (S114) is shown. In FIGS. 5A to 5D, the section of the p-type semiconductor region 14 of the Si semiconductor film 202 is shown.

Figure 5A:
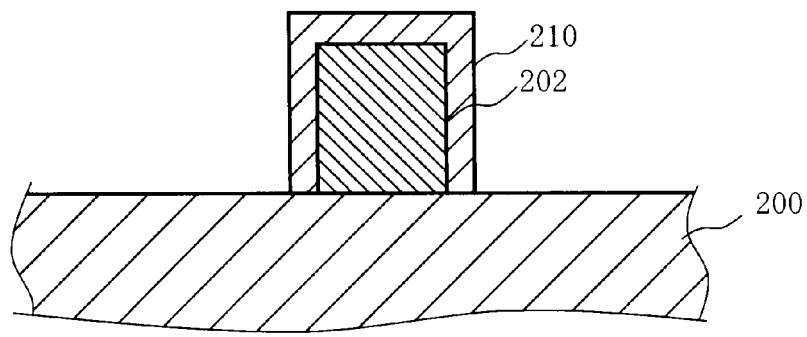
FIGS. 5A to 5D are process sectional views of the method for fabricating the semiconductor device according to the first embodiment.

A dielectric film is formed using one of oxide, nitride, and oxynitride on the Si semiconductor part into which the element (at least one of S, Se, or Te) has been implanted while performing heating treatment process. The oxide, for example, is used in this embodiment. In FIG. 5A, as the thermal oxidation process (S108), the silicon oxide film 210 is formed around the Si semiconductor film 202, here, on the top face and side face by heat treatment in an oxygen atmosphere. As process conditions, for example, the substrate temperature is heated to 100° C. in an oxygen plasma atmosphere in which the total pressure in a chamber becomes 10 Torr by dilution with Ar so that the partial pressure of oxygen becomes 1.0 Torr to produce the silicon oxide film 210. S in the density of $1\times10^{17}$ cm$^{-3}$ has been implanted and thus, oxidation proceeds up to 1 nm and then stops. After thermal oxidation of, for example, about 20 s, oxidation will not occur. If the amount of S is small, the Si nano-wire becomes still smaller and at the same time, the oxide film becomes thicker. In this case, the formed $SiO_2$ film may be thinner by etching.

Conceptual diagrams illustrating formation states of an oxide film in the first embodiment are shown in FIGS. 6A to 6C. A wire structure portion (Si rod) in a wire shape shown in FIG. 6A is compared with a case when doped or not doped with S. When, for example, an Si nano-wire is produced, a method is known by which a large wire structure in which the size of one side is about 50 nm to 20 nm is created by digging down to a certain depth by etching an Si substrate and then, the Si substrate is oxidized (if not specifically mentioned, similarly by nitriding or oxynitriding) to produce a fine nano-wire in which the size of one side is about 30 to 10 nm. However, when a fine nano-wire in which the size of one side is less than 10 nm is produced, if Si is thermally oxidized without being doped with S, control may not sufficiently be exercised so that in some cases, all is oxidized and the wire disappears. That is, a conventional method of producing a fine nano-wire less than 10 nm in size with stability has not been found. More specifically, if Si is thermally oxidized without being doped with S, as shown in FIG. 6B, oxidation occurs continuously and the line portion of Si is completely oxidized after about 1 min. That is, time control is needed to obtain an Si nano-wire and only non-uniform Si nano-wires are obtained. Particularly, it is very difficult to produce an Si nano-wire less than 10 nm in size.

By contrast, if S, Se, or Te is introduced into the interface between an Si nano-wire and an $SiO_2$ oxide film (an SiN film for nitriding and an SiON film for oxynitriding) to produce the Si nano-wire, Si surface dangling bonds in the interface are terminated by S, Se, or Te so that oxidation can be stopped. Accordingly, a fine Si nano-wire less than 10 nm in size can be produced. As a concrete method, as described above, the element selected from S, Se, and Te is introduced into an Si substrate by ion implantation in advance and annealing is performed to bring back crystallinity. Then, if the above heating process is performed, S, Se, or Te in Si is aggregated (piled up) in the interface between Si and $SiO_2$ and oxidation is stopped. The density of the interface is determined in accordance with the amount of S, Se, or Te introduced into the Si substrate and thus, the size of one side can be controlled by the amount of S, Se, or Te introduced into the Si substrate.

The reason why S, Se, or Te is aggregated in the interface is that if dangling bonds in the interface are terminated, extra electrons in a gap move to a valence band with stable energy.

Thus, if doped with S like in the first embodiment, as shown in FIG. 6C, oxidation stops after thermal oxidation so that an Si nano-wire of a desired size can be produced. Therefore, an Si nano-wire less than 10 nm in size can easily be fabricated. In such a case, the thickness of the oxide film is adjusted by, for example, reducing the amount of S (for example, ion implantation of about $1\times10^{16}$/cm$^{-3}$) to easily obtain an Si nano-wire of the size of about 10 nm.

If the amount of S is reduced, a case when the size of an Si nano-wire becomes smaller and at the same time, the oxide film therearound becomes thicker can be considered. In such a case, nitriding may first be performed to produce an SiN film in which more Si is contained than the stoichiometric ratio ($Si_3N_4$). In this case, an Si nano-wire is produced by nitriding (nitriding is automatically stopped with nitrogen plasma, at 100° C., at nitrogen partial pressure of 1.0 Torr, diluted by Ar, and at total pressure of 10 Torr). If the produced Si nano-wire is oxidized (similar to the case of direct oxidation with oxygen plasma, at 100° C., at oxygen partial pressure of 1.0 Torr, diluted by Ar, and at total pressure of 10 Torr), an $SiO_2$ film of about 1 nm in thickness can be formed in the Si/SiN interface and on both SiN faces. This process may be used.

Figure 7C:
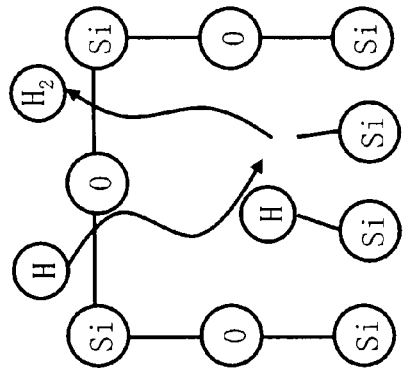
FIGS. 7A to 7D are diagrams showing bonding states of an interface between an Si nano-wire and $SiO_2$ oxide film in the first embodiment.
Figure 7B:
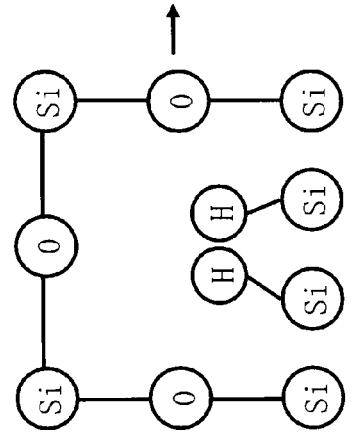
Figure 7D:
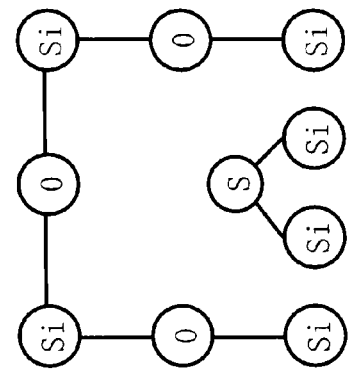
Figure 7A:
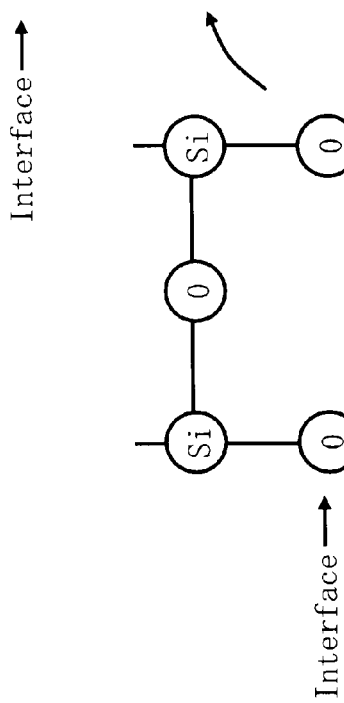

Bonding states of an interface between an Si nano-wire and $SiO_2$ oxide film in the first embodiment are shown in FIGS. 7A to 7D. If the conventional H termination as shown in FIG. 7B is performed on dangling bonds in the interface between Si and $SiO_2$ film as shown in FIG. 7A, electrons and holes are subject to phonon scattering, leading to reduced mobility. Further, as shown in FIG. 7C, hydrogen is easily disconnected under hydrogen attack. If the H termination is disconnected, dangling bonds become a charge trap. As a result, mobility is reduced and further, the threshold voltage is varied. On the other hand, if dangling bonds in the interface between Si and $SiO_2$ film as shown in FIG. 7A are terminated by the element such as S, Se, and Te in the first embodiment as shown in FIG. 7D, electrons and holes are less subject to phonon scattering than in the case of the H termination and the termination is less likely to be disconnected under hydrogen attack. Thus, stable termination can be formed.

H is bonded to one dangling bond of Si and is a very light element. By contrast, S, Se, and Te are bonded to two dangling bonds of Si when bound to Si. Further, compared with silicon, S, Se, and Te are very heavy elements. Thus, as a rough estimate, the bonding force is about twice and the weight is 16 times, 34 times, and 52 times respectively. In view of the above points, if terminated by S, Se, or Te, the vibration in the interface is proportional to $\sqrt{(\text{bonding force}/\text{weight})}$ and thus is about ⅓, ¼, and ⅕ respectively. That is, about three times, four times, and five times energy is needed to excite the vibration. As a result, energy of electrons and holes is not absorbed by interfacial phonons so that electrons and holes can maintain great mobility without being subject to phonon scattering. Further, interfacial phonons are not excited and the termination is not disconnected so that no charge trap occurs. This point is also very effective for the avoidance of mobility deterioration (no Coulomb scattering occurs) and the avoidance of threshold variation (no charge trap/detrap occurs).

How easy a local spin arises in the first embodiment will be compared and described using FIGS. 8A to 8C. If, as shown in FIG. 8A, dangling bonds remain in the interface between an Si nano-wire and $SiO_2$ oxide film without being terminated, a local spin, which becomes a scattering source, arises. By contrast, by terminating with the element such as S, Se, and Te like in the first embodiment, as shown in FIG. 8B, a local spin can be avoided. The element such as S, Se, and Te terminates by forming a bridge structure. Then, as a similar structure, as shown in FIG. 8C, a bridge structure can also be formed from oxygen (O). However, if a bridge structure is formed from oxygen, a local spin arises, which also becomes a scattering source. Further, stability is not very good due to the spin. Thus, it is difficult to extract properties that can be extracted from termination with S, Se, or Te from termination with oxygen.

Figure 5B:
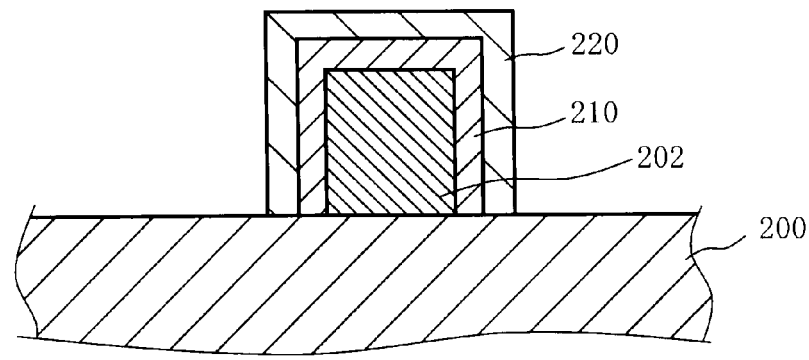

In FIG. 5B, as the Si nitride film formation process (S110), the Si nitride film 220 is formed around the silicon oxide film 210, here on the top face and side face thereof by the chemical vapor deposition (CVD) method. Here, a silicon nitride (SiN) film in which more Si is contained than the stoichiometric ratio ($Si_3N_4$) is formed.

Figure 5C:
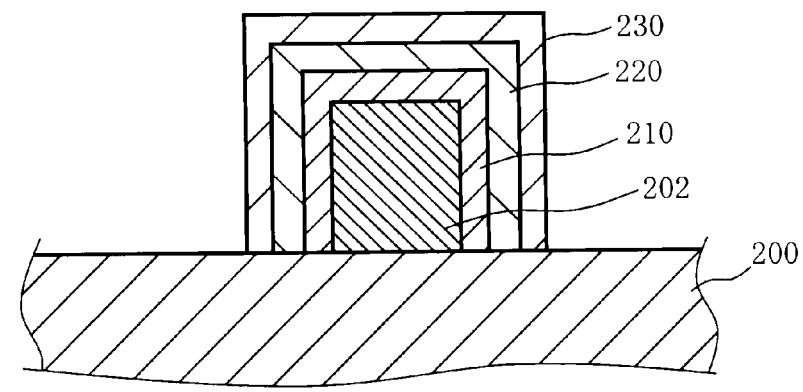

In FIG. 5C, as the Si oxide film formation process (S112), the silicon oxide film 230 is formed around the Si nitride film 220, here on the top face and side face thereof by the CVD method.

Figure 5D:
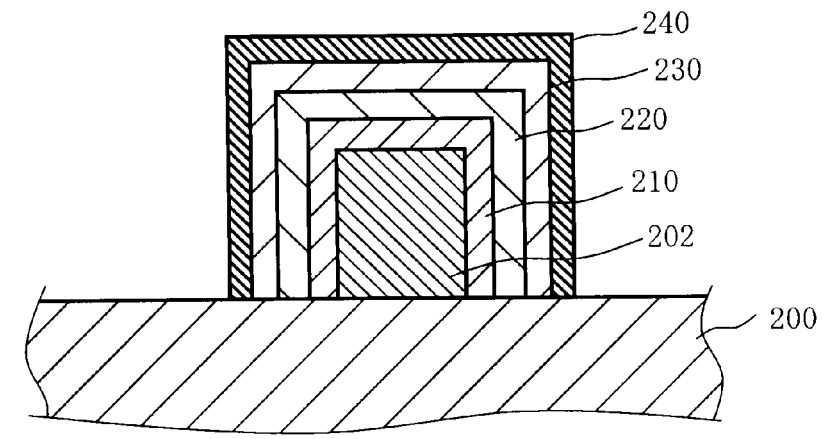

In FIG. 5D, as the electrode formation process (S114), the polysilicon film 240 is formed around the silicon oxide film 230, here on the top face and side face thereof by the CVD method. However, the polysilicon film 240 is formed in a control electrode (gate electrode) portion. More specifically, the polysilicon film 240 is formed in an upper portion of the p-type semiconductor region 14 of the Si semiconductor film 202 constituting an Si nano-wire and an upper portion of a connection portion of the n-type semiconductor region 20 adjacent to the p-type semiconductor region 14 on both sides thereof to the p-type semiconductor region 14.

FIGS. 5A to 5D illustrate that the silicon oxide film 210, the Si nitride film 220, and the silicon oxide film 230 are formed around the p-type semiconductor region 14 of the Si semiconductor film 202, here on the top face and side face thereof, but a dielectric film is also formed on the Si semiconductor substrate 200 other than the Si semiconductor film 202 constituting an Si nano-wire. Though not illustrated, the silicon oxide film 210, the Si nitride film 220, and the silicon oxide film 230 are also formed, for example, in a portion of the Si semiconductor substrate 200 excluding the Si semiconductor film 202. If the p-type Si semiconductor substrate 200 is used, the region of the Si semiconductor substrate 200 other than the Si semiconductor film 202 is formed of a p-type semiconductor. Thus, by forming a dielectric film on the surface thereof, direct contact of the polysilicon film 240 formed on the side face of the Si semiconductor film 202 and the p-type Si semiconductor substrate 200 can be avoided to insulate from each other. The dielectric film on the Si semiconductor substrate 200 other than the Si semiconductor film 202 constituting an Si nano-wire may be at least one of the silicon oxide film 210, the Si nitride film 220, and the silicon oxide film 230. Dielectric films not to be used may be removed by etching. Alternatively, a dielectric film different from the silicon oxide film 210, the Si nitride film 220, and the silicon oxide film 230 may be formed before the polysilicon film 240 being formed. On the other hand, if an SOI substrate is used, a silicon oxide film of the SOI substrate may be used to insulate the polysilicon film 240 on the side face of the Si semiconductor film 202 from the substrate and thus, the Si semiconductor film 202.

With the above configuration, a semiconductor device of a structure in which memory cells are arranged toward the depth of FIG. 5D can be formed. An NAND column is arranged in the depth direction of the drawing.

An NAND flash memory produced as described above has the interface termination that is more stable than the conventional H termination and can realize a sufficiently low interface state and maintain the state during operation. As a result, there is practically no threshold variation during operation and practically no mobility deterioration is recognized. That is, a highly reliable high-speed memory can be obtained.

If the conventional H termination is used, the H termination is disconnected and thus, the threshold may vary in use, leading to a non-operating state. A repeating test of writing and erasing as cells shows that variations of about 0.2 V are caused in about 1% of cells in about ten thousand repetitions. In this case, NAND columns containing such cells are detached, leading to lower memory capacities. If terminated with S, Se, or Te like in the first embodiment, by contrast, threshold variations of 0.2 V are observed in cells of only 0.001% or less in a similar test. Regarding the threshold variations, similar results are obtained in tests of PBTI and NBTI of normal nMOSFET and pMOSFET. Thus, threshold variations in these semiconductor devices can also be expected to be reduced to a level of $\frac{1}{1000}$ or less.

A significant improvement in mobility is also made. In the conventional H termination, the peak value of mobility is about 300 $cm^2/Vs$ in nMOSFET and about 50 $cm^2/Vs$ in pMOSFET. In the H termination, properties decline rapidly when the H termination is disconnected in use. The mobility declines to 200 $cm^2/Vs$ or less and 40 $cm^2/Vs$ or less respectively. According to the first embodiment, by contrast, the mobility is improved to about 400 $cm^2/Vs$ and 60 $cm^2/Vs$ respectively and hardly varies over time.

Figure 9:
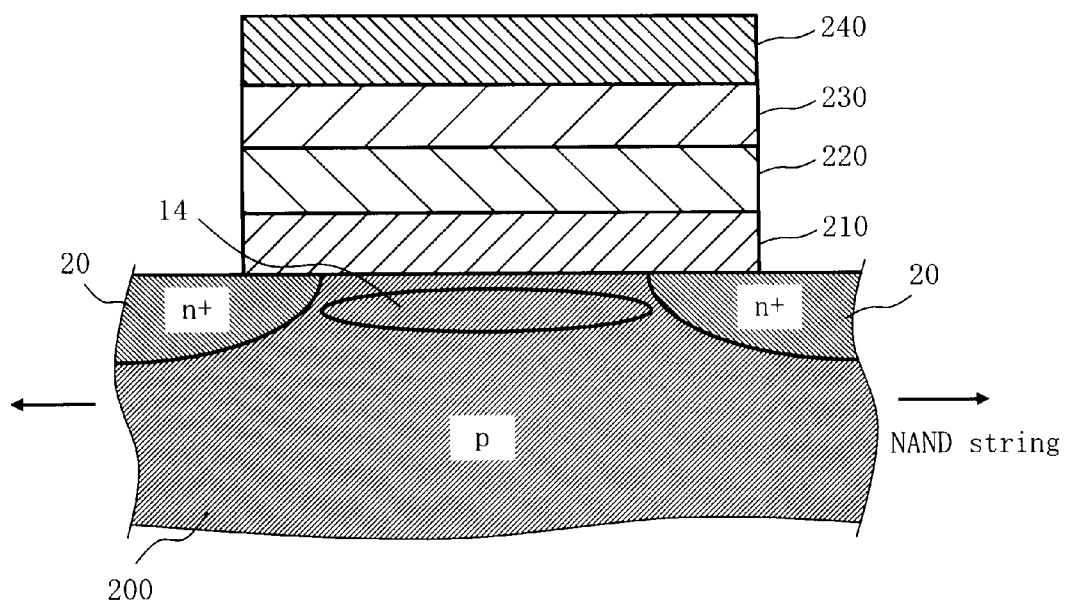
FIG. 9 is a diagram showing an example of a section of MOSFET arranged in a direction in which the Si nano-wire in the first embodiment extends.

An example of a section of MOSFET arranged in a direction in which the Si nano-wire in the first embodiment extends is shown in FIG. 9. In FIG. 9, the n-type semiconductor region 20, the p-type semiconductor region 14, and the n-type semiconductor region 20 are arranged adjacent to each other on the Si semiconductor substrate 200. FIG. 9 shows an example in which the silicon oxide film 210, the Si nitride film 220, the silicon oxide film 230, and the polysilicon film 240 are formed only in a control electrode (gate electrode) portion is shown. In other words, the silicon oxide film 210, the Si nitride film 220, the silicon oxide film 230, and the polysilicon film 240 are formed only on the p-type semiconductor region 14 in the center and portions where the n-type semiconductor regions 20 adjacent to the p-type semiconductor region 14 on both sides are in contact with the p-type semiconductor region 14. With the above configuration, one memory cell is configured. The memory structure of an NAND column may suitably be formed by repeatedly forming the above configuration in a direction in which an Si nano-wire extends. If the channel length becomes shorter in the configuration in FIG. 9, the configuration may further be formed as described below.

Figure 10:
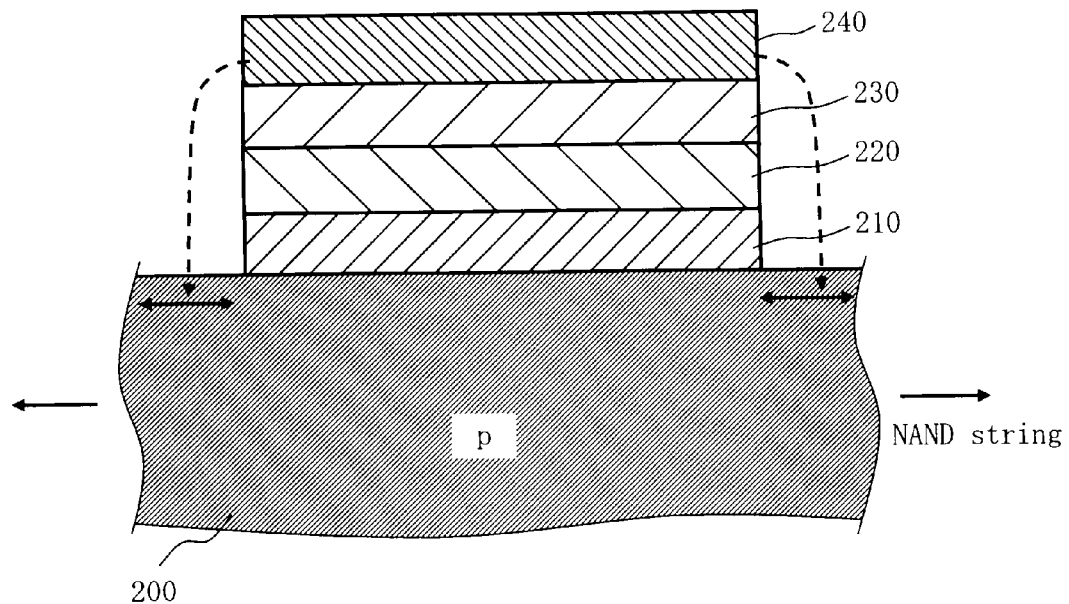
FIG. 10 is a diagram showing another example of the section of MOSFET arranged in the direction in which the Si nano-wire in the first embodiment extends.

Another example of the section of MOSFET arranged in the direction in which the Si nano-wire in the first embodiment extends is shown in FIG. 10. With a decreasing channel length, a configuration in which no source/drain region is formed becomes possible. If the channel length is shortened to 20 nm or less, the size of a source/drain portion also becomes 20 nm or less, which makes improvement in alignment precision in subsequent processes necessary. However, if the size of a source/drain portion is, for example, 20 nm or less, it becomes possible to cause inversion, that is, a conversion from the p-type to the n-type only by an electric field from the control electrode. In other words, a p-type semiconductor region on which the polysilicon film 240 is not formed can be converted into the n-type. Thus, in such a case, as shown in FIG. 10, the above n-type ion implantation process (S102) can be omitted. Thus, the formation of n-type regions can be made unnecessary. Without the need to form n-type regions, the production thereof is made easier, which is effective for cost reduction and yield improvement.

Figure 11:
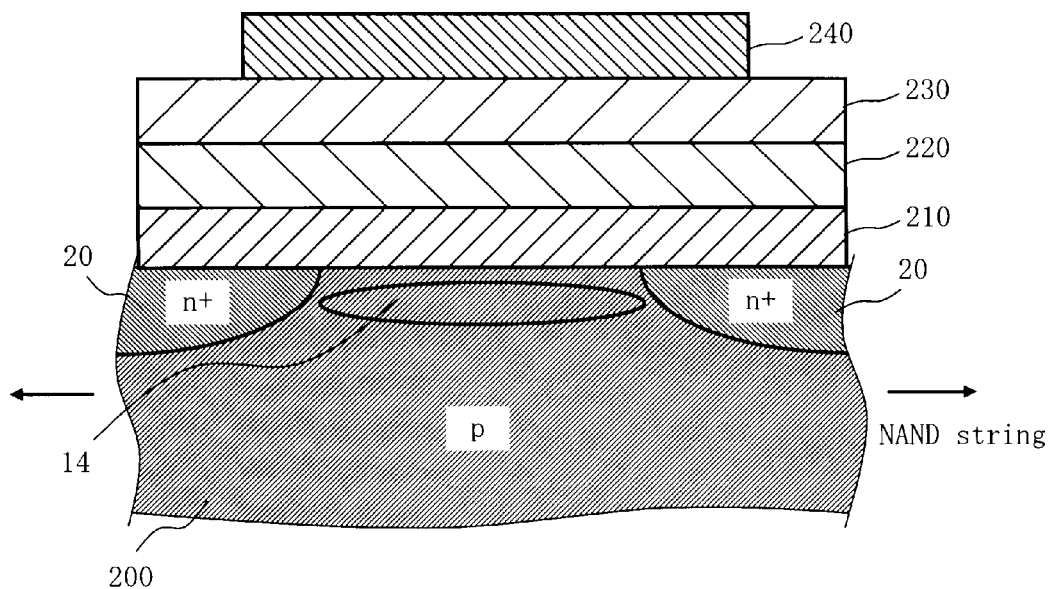
FIG. 11 is a diagram showing still another example of the section of MOSFET arranged in the direction in which the Si nano-wire in the first embodiment extends.

Another example of the section of MOSFET arranged in the direction in which the Si nano-wire in the first embodiment extends is shown in FIG. 11. In FIG. 11, like in FIG. 9, the n-type semiconductor region 20, the p-type semiconductor region 14, and the n-type semiconductor region 20 are arranged adjacent to each other on the Si semiconductor substrate 200. Then, in FIG. 11, the silicon oxide film 210, the Si nitride film 220, and the silicon oxide film 230 are formed not only in the control electrode (gate electrode) portion, but also in the source/drain region. FIG. 11 shows an example in which only the polysilicon film 240 is formed in the control electrode (gate electrode) portion only. In other words, a laminated film of the silicon oxide film 210, the Si nitride film 220, and the silicon oxide film 230 is formed over the entire region of the p-type semiconductor region 14 in the center and the n-type semiconductor regions 20 adjacent to the p-type semiconductor region 14 on both sides. On the other hand, only the polysilicon film 240 is formed only on the p-type semiconductor region 14 in the center and portions where the n-type semiconductor regions 20 adjacent to the p-type semiconductor region 14 on both sides are in contact with the p-type semiconductor region 14. With the above configuration, one memory cell is configured. The memory structure of an NAND column may suitably be formed by repeatedly forming the above configuration in a direction in which an Si nano-wire extends. The charge accumulation layer is configured by the Si nitride film 220, instead of a conductive film of polysilicon or the like and thus, even if the Si nitride film 220 of a memory cell here and the Si nitride film 220 of a memory cell formed adjacent thereto should come into contact or be integrated, an influence thereof on charge accumulation can practically be ignored. With the above configuration, damage to the substrate or dielectric film can be mitigated because there is no need to dig down to the substrate in a dielectric film portion (tunnel film/trap film/block film) of the source/drain portion. If the channel length also becomes shorter in the configuration in FIG. 11, the configuration may further be formed as described below.

Figure 12:
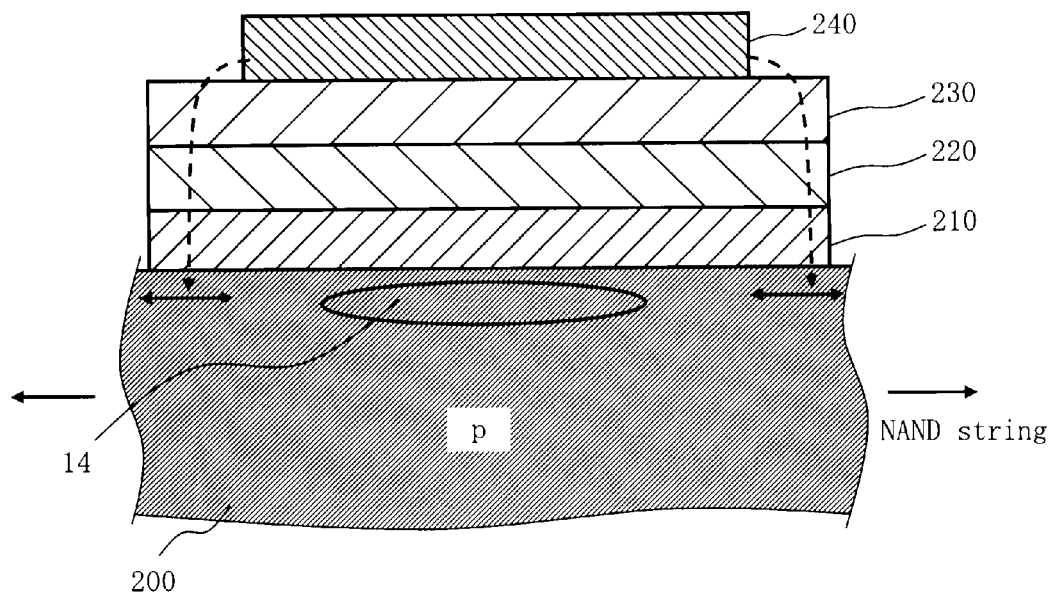
FIG. 12 is a diagram showing still another example of the section of MOSFET arranged in the direction in which the Si nano-wire in the first embodiment extends.

Another example of the section of MOSFET arranged in the direction in which the Si nano-wire in the first embodiment extends is shown in FIG. 12. Also in the example in FIG. 11, with a decreasing channel length, a configuration in which no source/drain region is formed becomes possible. If the size of a source/drain portion is, for example, 20 nm or less, it becomes possible to cause inversion, that is, a conversion from the p-type to the n-type only by an electric field from the control electrode. In other words, a p-type semiconductor region on which the polysilicon film 240 is not formed can be converted into the n-type. Thus, in such a case, as shown in FIG. 12, the above n-type ion implantation process (S102) can be omitted. Thus, the formation of n-type regions can be made unnecessary. Without the need to form n-type regions, the production thereof is made easier, which is effective for cost reduction and yield improvement.

The above configurations in FIGS. 9 to 12 are not limited to an Si nano-wire and can similarly be applied to normal MOSFET. In other words, an effect similar to the above effect can be gained in any transistor element by termination with S, Se, or Te in the interface between a gate dielectric film and Si in a layer below the gate dielectric film.

The above examples show a case when one column of Si nano-wire is formed on the Si semiconductor substrate 200, but the present embodiment is not limited to such a case.

Figure 13:
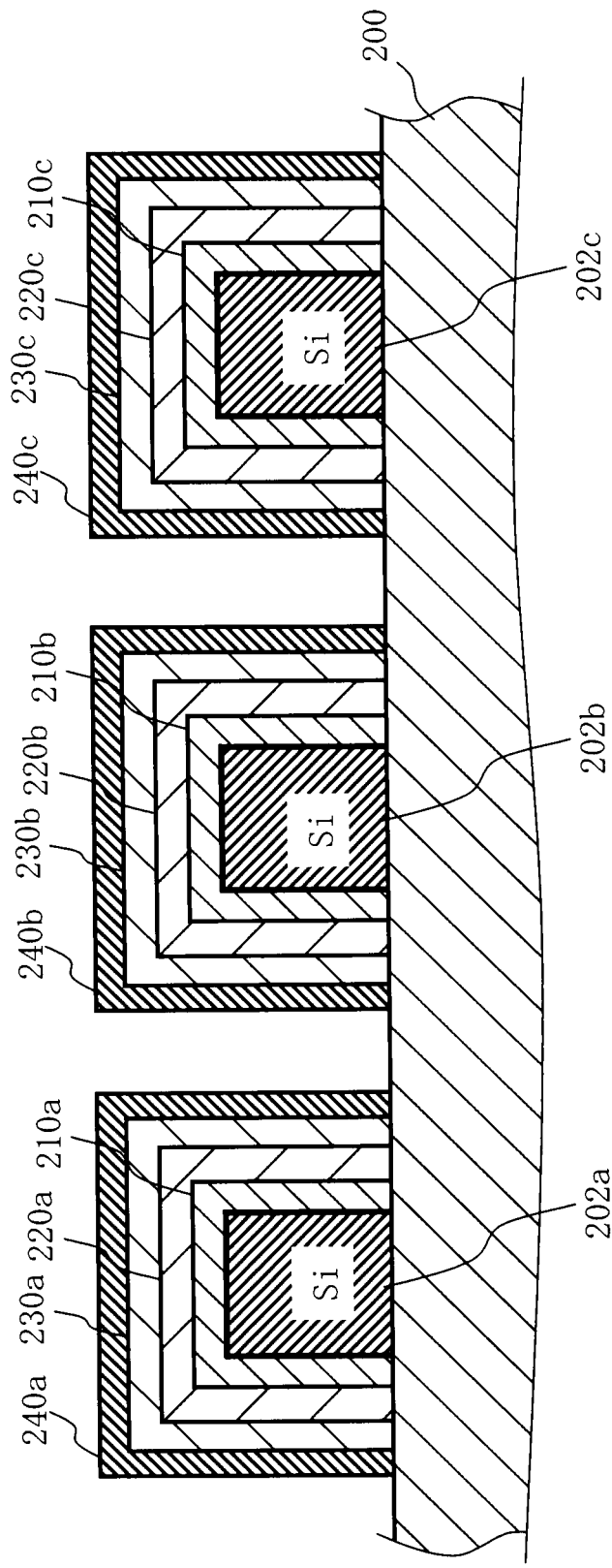
FIG. 13 is a sectional view showing another example of the configuration of the semiconductor device according to the first embodiment.

Another example of the configuration of the semiconductor device according to the first embodiment is shown in FIG. 13 as a sectional view. In FIG. 13, a semiconductor device in which a plurality of columns of Si nano-wires shown in FIG. 1 is arranged in a horizontal direction (lateral direction) with respect to the substrate surface. The configuration of each Si nano-wire is the same as that shown in FIG. 1. Here, as an example, Si nano-wires in three columns are shown. Each column has a structure in which many MOSFETs are arranged. This is, for example, a structure called an NAND column or NAND string. Such a semiconductor device is an example of, for example, the NAND-type flash memory.

More specifically, three Si semiconductor films 202a, 202b, 202c are formed on the p-type Si semiconductor substrate 200. Each of the Si semiconductor films 202a, 202b, 202c is an example of the Si semiconductor part. For example, the Si semiconductor film 202 whose one side has a size of 10 nm or less is formed. Each of the Si semiconductor films 202 has the silicon oxide film ($SiO_2$ film) 210 formed therearound, here on the top face and side face thereof. Instead of oxide, nitride or oxynitride may also be used. More specifically, instead of the silicon oxide film 210, a silicon nitride film (SiN film) or silicon oxynitride film (SiON film) may be used. That at least one element A of S, Se, and Te is caused to be present in the interface between each of the Si semiconductor films 202 and the corresponding silicon oxide film 210 is as described above. Then, the Si nitride film 220 is formed around each of the silicon oxide films 210, here on the top face and side face thereof. The silicon oxide film 230 is formed around each of the Si nitride films 220, here on the top face and side face thereof. Then, the polysilicon film 240 is formed around each of the silicon oxide films 230, here on the top face and side face thereof and in the control electrode (gate electrode) portion.

To form a semiconductor device of such a plurality of columns of Si nano-wires, a plurality of columns of the Si semiconductor films 202 in a wire shape may be formed in a direction perpendicular to the above n-type line by etching in the above wire processing process (S106). For example, the width of each wire structure portion (line portion) is set to 30 nm and a space portion between each wire structure portion is set to 50 nm. Then, by digging down to the depth of, for example, 14 nm in the space portion, the three Si semiconductor films 202 arranged as a convex wire structure of a portion of the Si semiconductor substrate 200 are formed. Accordingly, as described above, each of the Si semiconductor films 202 can form a structure in which the p-type Si semiconductor region 14 and the n-type semiconductor region 20 are alternately arranged. In this case, each of the Si semiconductor films 202 is similarly formed in such a way that, among faces of each of the Si semiconductor films 202, the crystal orientation of the side face becomes the (100) or (−100) orientation toward the direction in which the wire extends and each top face becomes the (001) orientation. Other fabrication processes are as described above. Incidentally, a dielectric film (not shown) is similarly formed on the Si semiconductor substrate 200 to be insulated from each of the polysilicon films 240. By arranging a plurality of columns, as described above, the memory capacity can be increased two-dimensionally.

Second Embodiment

In the first embodiment, as shown in FIG. 1, an example in which the memory capacity of an NAND type memory by one column of Si nano-wire in which many MOSFETs are arranged on a substrate is increased by, as shown in FIG. 13, forming a plurality of columns of Si nano-wires two-dimensionally is described. In the second embodiment, a semiconductor device in which the memory capacity is increased three-dimensionally is described. Hereinafter, content not specifically described is the same as in the first embodiment.

Figure 14:
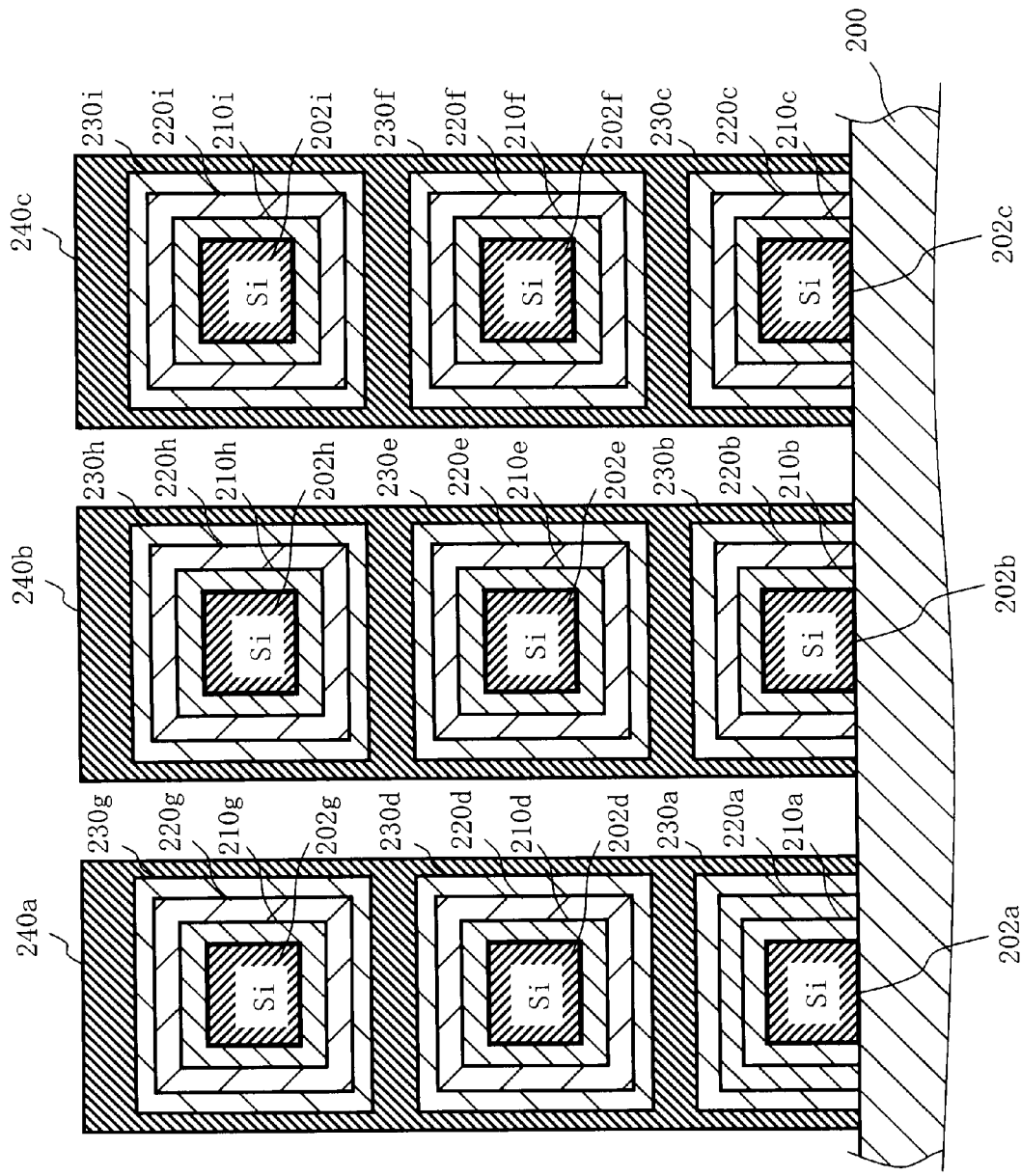
FIG. 14 is a sectional view showing an example of the configuration of the semiconductor device according to a second embodiment.

A sectional view showing an example of the configuration of the semiconductor device according to the second embodiment is shown in FIG. 14. In FIG. 14, as a semiconductor device in the second embodiment, an example of the memory element by, for example, Si nano-wires arranged in a plurality of columns three-dimensionally is shown. In such a semiconductor device, each column has a structure in which many MOSFETs are arranged toward the depth of the drawing. This is, for example, a structure called an NAND column or NAND string. Such a semiconductor device is an example of, for example, the NAND-type flash memory.

In FIG. 14, a plurality of columns of the Si semiconductor films 202 is formed three-dimensionally on the Si semiconductor substrate 200. In the first stage, for example, three columns of Si semiconductor films 202a, 202b, 202c are arranged. In the second stage, for example, three columns of Si semiconductor films 202d, 202e, 202f are arranged. In the third stage, for example, three columns of Si semiconductor films 202g, 202h, 202i are arranged. A space portion is provided between each stage and between each column. The configuration of each of the Si semiconductor films 202 is the same as that shown in FIG. 1. More specifically, each of the Si semiconductor films 202 is formed in a structure in a wire shape extending toward the depth of the drawing. Then, for example, a structure in which p-type and n-type Si semiconductor regions are alternately arranged toward the depth of the drawing can suitably be adopted. Each of the Si semiconductor films 202 is an example of the Si semiconductor part. For example, the Si semiconductor film 202 whose one side has a size of 10 nm or less is formed.

Silicon oxide films 210a, 210b, 210c are respectively formed around the corresponding Si semiconductor film of the Si semiconductor films 202a, 202b, 202c in the first stage, here on the top face and side face thereof. Silicon oxide films 210d, 210e, 210f, 210g, 210h, 210i are formed around the Si semiconductor films 202d, 202e, 202f, 202g, 202h, 202i in the second and subsequent stage, here on the top and bottom faces and side face thereof. Here, the silicon oxide film 210 is used as an example, but the present embodiment is not limited to this. For example, instead of oxide, nitride or oxynitride may be used.

That at least one element A of S, Se, and Te is caused to be present in the interface between each of the Si semiconductor films 202 and the corresponding silicon oxide film 210 is the same as in the first embodiment. Accordingly, dangling bonds of Si in each of the Si semiconductor films 202 and the element A are bonded for termination in the interface with the silicon oxide film 210. As a result, the interface between each of the Si semiconductor films 202 and the corresponding silicon oxide film 210 can be stabilized. Each of the silicon oxide films 210 becomes, for example, a tunnel dielectric film. Each of the silicon oxide films 210 is formed to a thickness of, for example, 1 nm.

Si nitride films 220a, 220b, 220c are respectively formed around the corresponding silicon oxide film of the silicon oxide films 210 in the first stage, here on the top face and side face thereof. Si nitride films 220d, 220e, 220f, 220g, 220h, 220i are formed around each of the silicon oxide films 210d, 210e, 210f, 210g, 210h, 210i in the second and subsequent stage, here on the top and bottom faces and side face thereof. Each of the Si nitride films 220 becomes an example of the charge accumulation film. That the Si nitride film 220 suitably uses silicon nitride (SiN) in which more Si is contained than the stoichiometric ratio ($Si_3N_4$) is as described above. The Si nitride film 220 is formed to a thickness of, for example, 0.5 nm.

Silicon oxide films 230a, 230b, 230c are respectively formed around the corresponding Si nitride film of the Si nitride films 220a, 220b, 220c in the first stage, here on the top face and side face thereof. Silicon oxide films 230d, 230e, 230f, 230g, 230h, 230i are formed around each of the Si nitride films 220d, 220e, 220f, 220g, 220h, 220i in the second and subsequent stage, here on the top and bottom faces and side face thereof. The silicon oxide film 230 becomes an example of the block film. Each of the silicon oxide films 230 is formed to a thickness of, for example, 1 nm.

Polysilicon films 240a, 240b, 240c are formed in a control electrode (gate electrode) portion as if to cover each column of a plurality of stages independently. More specifically, the polysilicon film 240a is formed on the side face of the silicon oxide films 230a, 230d, 230g in the first, second, and third stages of the first column, a gap between the silicon oxide films 230a, 230d in the first and second stages, a gap between the silicon oxide films 230d, 230g in the second and third stages, and in each control electrode (gate electrode) portion of the top face of the silicon oxide film 230g in the third stage. Similarly, the polysilicon film 240b is formed on the side face of the silicon oxide films 230b, 230e, 230h in the first, second, and third stages of the second column, a gap between the silicon oxide films 230b, 230e in the first and second stages, a gap between the silicon oxide films 230e, 230h in the second and third stages, and in each control electrode (gate electrode) portion of the top face of the silicon oxide film 230h in the third stage. Similarly, the polysilicon film 240c is formed on the side face of the silicon oxide films 230c, 230f, 230i in the first, second, and third stages of the third column, a gap between the silicon oxide films 230c, 230f in the first and second stages, a gap between the silicon oxide films 230f, 230i in the second and third stages, and in each control electrode (gate electrode) portion of the top face of the silicon oxide film 230i in the third stage.

Though not illustrated, the Si semiconductor substrate 200 has a dielectric film such as an oxide film formed on the surface thereof to insulate the Si semiconductor substrate 200 from each of the polysilicon films 240a, 240b, 240c. Alternatively, the SOI substrate may also be suitably used in advance as the Si semiconductor substrate 200. Then, the Si semiconductor film in an upper layer of the SOI substrate may suitably be processed to use the Si semiconductor film as the Si semiconductor films 202a, 202b, 202c in the first stage described above.

Figure 15A:
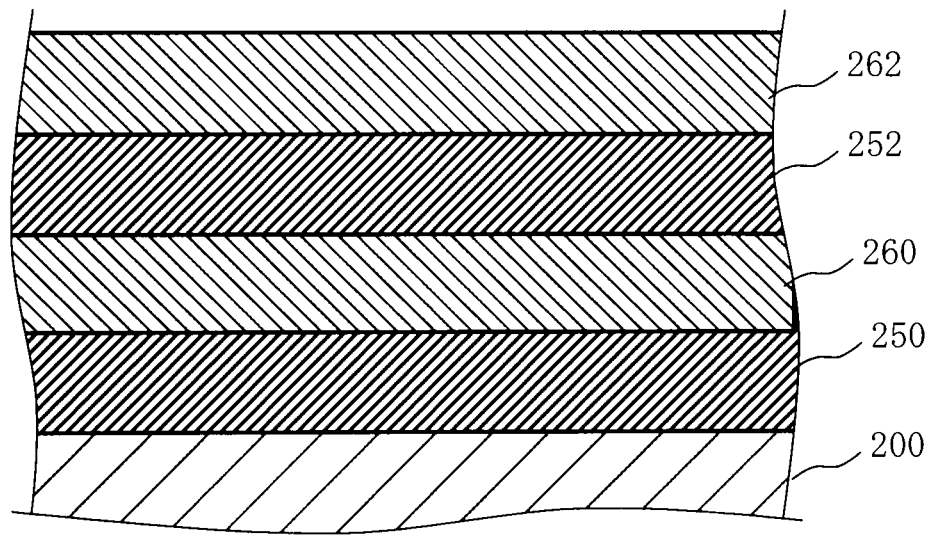
FIGS. 15A and 15B are process sectional views of the method for fabricating the semiconductor device according to the second embodiment.
Figure 15B:
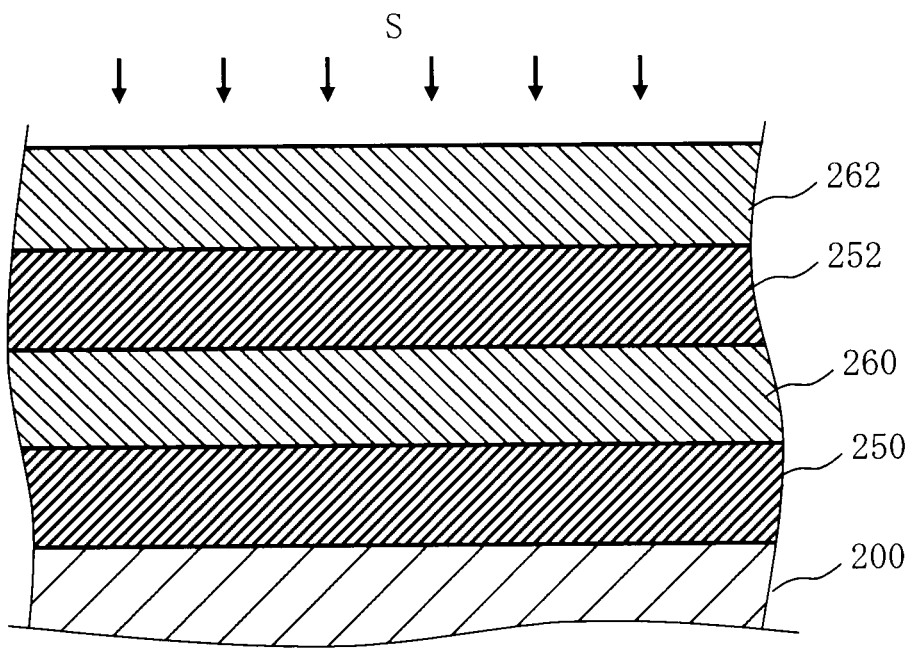

Process sectional views of the method for fabricating the semiconductor device according to the second embodiment are shown in FIGS. 15A and 15B. In FIGS. 15A and 15B, a laminated structure formation process, an n-type ion implantation process, and an S ion implantation process are shown.

In FIG. 15A, as the laminated structure formation process, a silicon germanium (SiGe) film 250, a p-type Si film 260, an SiGe film 252, and a p-type Si film 262 are epitaxially grown in this order on the p-type semiconductor substrate 200 by the CVD method. For epitaxial growth of Si, Ge and a p-type impurity may alternately be supplied as additives.

Then, as the n-type ion implantation process, an n-type impurity is selectively implanted into the p-type Si semiconductor substrate 200, the SiGe film 250, the p-type Si film 260, the SiGe film 252, and the p-type Si film 262 to form the n-type semiconductor region 20 in the p-type Si semiconductor substrate 200, the SiGe film 250, the p-type Si film 260, the SiGe film 252, and the p-type Si film 262. For example, a line of the n-type semiconductor region 20 (n-type semiconductor part) is formed in a p-type semiconductor region with the line width of 20 nm.

In FIG. 15B, as the S ion implantation process, S ions are implanted from the entire surface of the Si semiconductor substrate having a laminated film formed thereon in which all of the p-type Si semiconductor substrate 200, the SiGe film 250, the p-type Si film 260, the SiGe film 252, and the p-type Si film 262 having a line structure in which a p-type semiconductor region and an n-type semiconductor region are alternately arranged. Here, S ions are implanted so that the Si semiconductor substrate 200 is reached. The element to be implanted is not limited to S. As described above, at least one element A from S, Se, and Te can be used. Also here, the implantation amount of S ions is controlled by considering the size of an Si nano-wire.

Figure 16A:
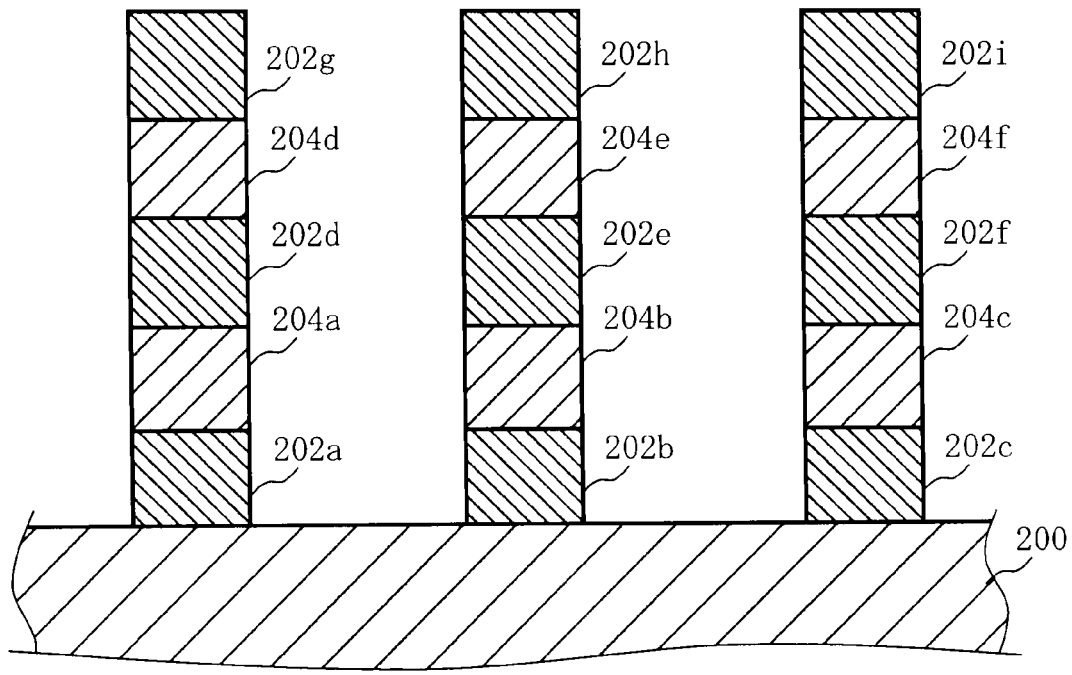
FIGS. 16A and 16B are process sectional views of the method for fabricating the semiconductor device according to the second embodiment.
Figure 16B:
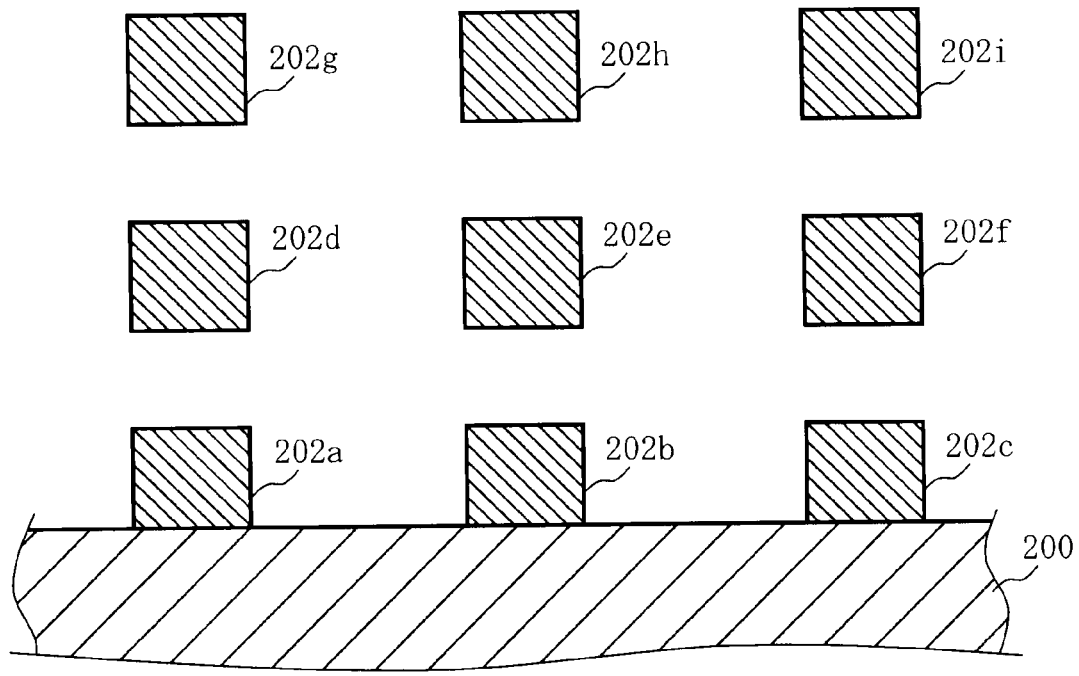

Process sectional views of the method for fabricating the semiconductor device according to the second embodiment are shown in FIGS. 16A and 16B. In FIGS. 16A and 16B, an etching process and an SiGe film removal process are shown.

In FIG. 16A, as the etching process, a structure portion of a plurality of columns in a wire shape is formed in a direction perpendicular to the above n-type line by etching so that some midpoint of the Si semiconductor substrate 200 is reached from the p-type Si film 262. For example, the width of each wire structure portion (line portion) is set to 30 nm and a space portion between each wire structure portion is set to 50 nm. As the space portion of the Si semiconductor substrate 200, up to the depth of, for example, 14 nm is dug down. With the above processing, the wire structure portion of the first column has a structure in which the p-type Si semiconductor film 202a, an SiGe film 204a, the p-type Si semiconductor film 202d, an SiGe film 204d, and the p-type Si semiconductor film 202g are stacked in this order from the lower stage. Similarly, the wire structure portion of the second column has a structure in which the p-type Si semiconductor film 202b, an SiGe film 204b, the p-type Si semiconductor film 202e, an SiGe film 204e, and the p-type Si semiconductor film 202h are stacked in this order from the lower stage. Similarly, the wire structure portion of the third column has a structure in which the p-type Si semiconductor film 202c, an SiGe film 204c, the p-type Si semiconductor film 202f, an SiGe film 204f, and the p-type Si semiconductor film 202i are stacked in this order from the lower stage.

In FIG. 16B, as the SiGe film removal process, each of the SiGe films 204 is removed by wet etching. Accordingly, the p-type Si semiconductor film 202a, the p-type Si semiconductor film 202d, and the p-type Si semiconductor film 202g are formed from the lower stage with a gap formed therebetween in the wire structure portion of the first column. Similarly, the p-type Si semiconductor film 202b, the p-type Si semiconductor film 202e, and the p-type Si semiconductor film 202h are formed from the lower stage with a gap formed therebetween in the wire structure portion of the second column. Similarly, the p-type Si semiconductor film 202c, the p-type Si semiconductor film 202f, and the p-type Si semiconductor film 202i are formed from the lower stage with a gap formed therebetween in the wire structure portion of the third column.

Figure 17:
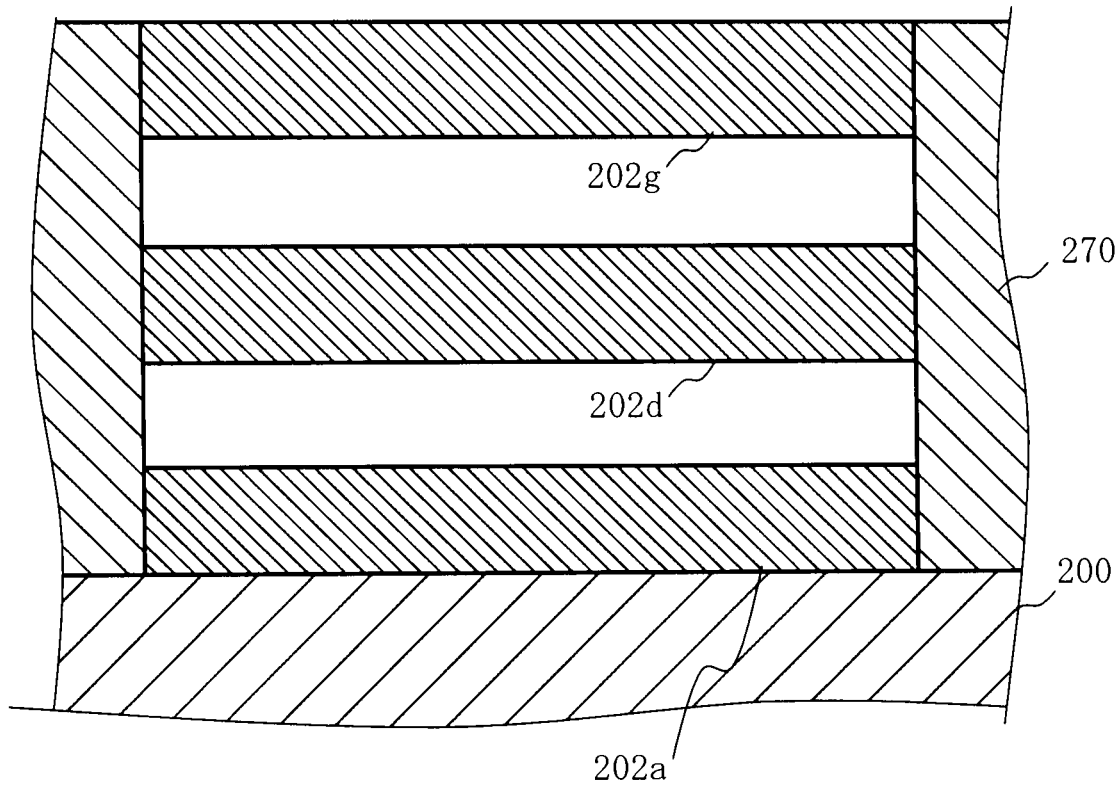
FIG. 17 is a process sectional view of a wire structure according to the second embodiment in a longitudinal direction.

A process sectional view of a wire structure according to the second embodiment in a longitudinal direction is shown in FIG. 17. In FIG. 17, as an example, the wire structure portion of the first column is shown. As shown in FIG. 17, it is needless to say that each wire structure portion has a support portion 270 to support the beam of each wire structure portion formed on both sides thereof.

After such a three-dimensional wire structure being formed, the thermal oxidation process (S108), the Si nitride film formation process (S110), and the Si oxide film formation process (S112) described above are undergone to form the silicon oxide film 210, the Si nitride film 220, and the silicon oxide film 230 in this order on the top face and side face of the Si semiconductor film 202 in the first stage and on the top and bottom faces and side face of the Si semiconductor film 202 in the second and subsequent stage. Content of each process is the same as that in the first embodiment. Then, ion-implanted S is aggregated (piled up) on the exposed surface (interface between Si and $SiO_2$) of each of the Si semiconductor films 202 by heat treatment in the thermal oxidation process (S108) to terminate dangling bonds of Si in the interface with the silicon oxide film 210. As a result, as described above, oxidation can be stopped during oxidation. If the size of each Si nano-wire is made smaller, as described above, nitriding may first be performed to produce an SiN film in which more Si is contained than the stoichiometric ratio ($Si_3N_4$). In this case, as described above, an Si nano-wire is produced by nitriding (nitriding is automatically stopped with nitrogen plasma, at 100° C., at nitrogen partial pressure of 1.0 Torr, diluted by Ar, and at total pressure of 10 Torr). If the produced Si nano-wire is oxidized (similar to the case of direct oxidation with oxygen plasma, at 100° C., at oxygen partial pressure of 1.0 Torr, diluted by Ar, and at total pressure of 10 Torr), an $SiO_2$ film of about 1 nm in thickness can be formed in the Si/SiN interface and on SiN surface.

Then, as the electrode formation process (S114), the polysilicon films 240a, 240b, 240c are formed in the control electrode (gate electrode) portion of the wire structure of each column by using the CVD method. By undergoing the above processes, an NAND-type memory by an Si nano-wire having a three-dimensional structure shown in FIG. 14 can be formed. p-type Si epitaxially grown on a substrate forms a channel three-dimensionally. While a polysilicon channel has high resistance and it is difficult to form a three-dimensional structure therefrom, a high-performance three-dimensional memory of a single crystal channel can be realized by using the above method. By arranging a plurality of columns in a plurality of stages, as described above, the memory capacity can be increased three-dimensionally.

According to the second embodiment, as described above, the memory capacity can be increased three-dimensionally and like in the first embodiment, effects of suppressing mobility deterioration and suppressing variations in threshold voltage can be gained.

Third Embodiment

In each of the above embodiments, a case when each Si nano-wire has a structure in which a plurality of MOSFETs is linked to an NAND column is described, but the embodiments are not limited to such a case. Hereinafter, content not specifically described is the same as in the first embodiment.

Figure 18A:
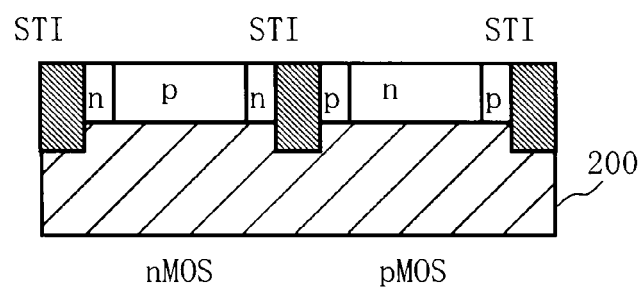
FIGS. 18A to 18C are diagrams showing the configuration of an Si semiconductor substrate according to a third embodiment.
Figures 18B, 18C:
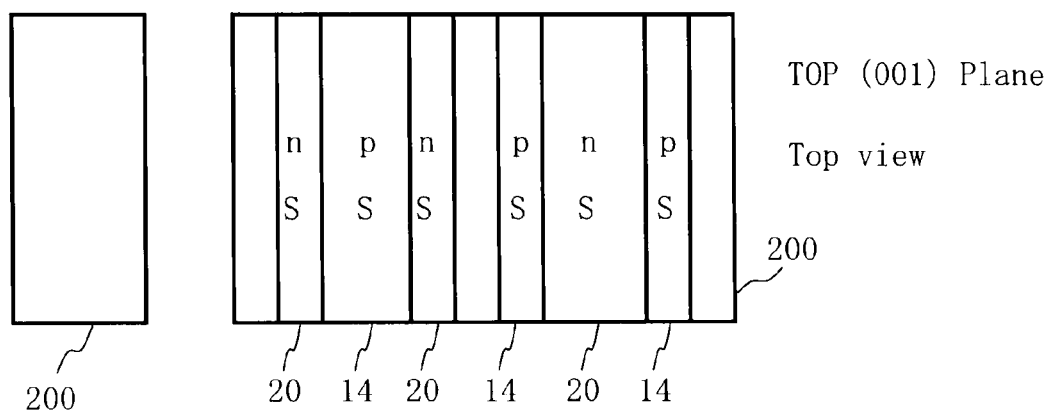

The configuration of an Si semiconductor substrate according to the third embodiment is shown in FIGS. 18A to 18C. FIG. 18A shows a sectional view, FIG. 18B shows a top view, and FIG. 18C shows a left side view. First, a line of a device isolation region (STI region) is formed on the p-type semiconductor substrate 200. A silicon oxide film or the like may be embedded in such a region in advance.

Then, as the n-type ion implantation process (S102), an n-type impurity is selectively implanted into the p-type Si semiconductor substrate 200 to form the n-type semiconductor region 20 in the p-type Si semiconductor substrate 200. For example, a line of the n-type semiconductor region 20 (n-type semiconductor part) is formed in a p-type Si semiconductor region with the line width of 20 nm. Here, the p-type semiconductor part 14 and the n-type semiconductor parts 20 on both sides thereof are formed in some element region to form foundations for an nMOS structure. Then, the n-type semiconductor part 20 and the p-type semiconductor parts 14 on both sides thereof are formed in the adjacent element region across a device isolation region to form foundations for a pMOS structure. For the n-type semiconductor part 20, n-type impurity ions may be implanted in a region corresponding to the n-type semiconductor part 20 linearly.

Then, as the S ion implantation process (S104), S ions are implanted from the entire surface of the p-type Si semiconductor substrate 200. The element to be implanted is not limited to S. As described above, at least one element A from S, Se, and Te can be used. Also here, the implantation amount of S ions is controlled by considering the size of an Si nanowire.

Figure 19A:
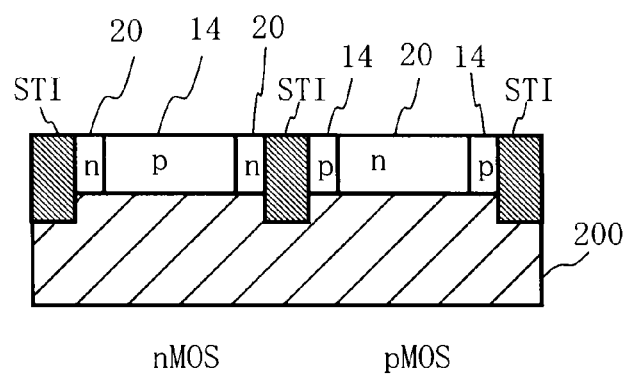
FIGS. 19A to 19C are diagrams showing the configuration of a wire-processed Si semiconductor part according to the third embodiment.
Figures 19B, 19C:
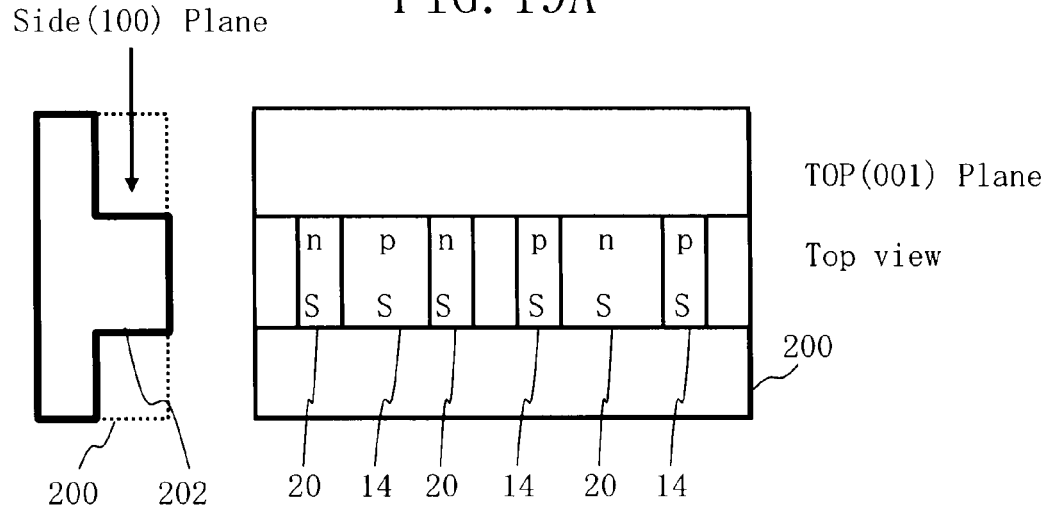

The configuration of a wire-processed Si semiconductor part according to the third embodiment is shown in FIGS. 19A to 19C. FIG. 19A shows a sectional view, FIG. 19B shows a top view, and FIG. 19C shows a left side view.

As the wire processing process (S106), the Si semiconductor film 202 in a wire shape is formed in a direction perpendicular to the above n-type line by etching. Processing content is the same as that in the first embodiment.

Figure 20A:
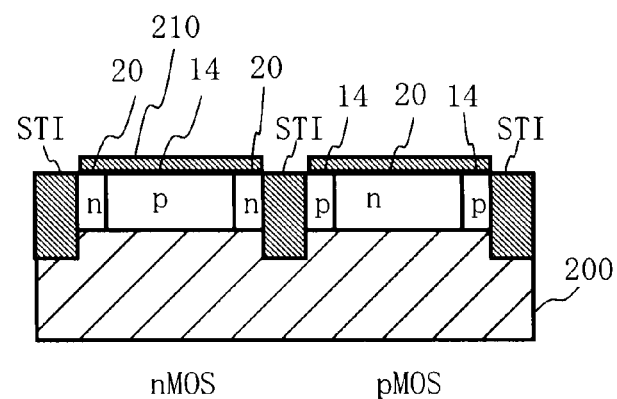
FIGS. 20A to 20C are diagrams showing the configuration after thermal oxidation of the wire-processed Si semiconductor part according to the third embodiment.
Figures 20B, 20C:
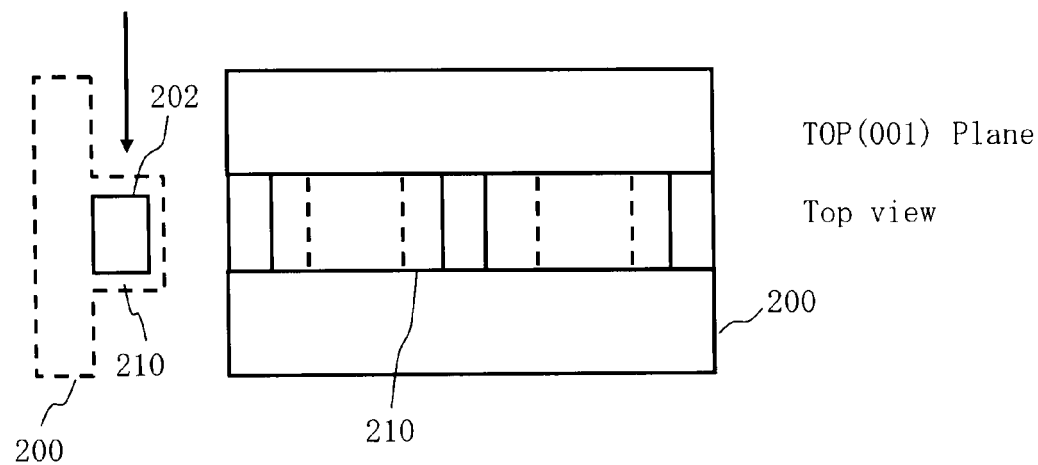

The configuration after thermal oxidation of the wire-processed Si semiconductor part according to the third embodiment is shown in FIGS. 20A to 20C. FIG. 20A shows a sectional view, FIG. 20B shows a top view, and FIG. 20C shows a left side view.

As the thermal oxidation process (S108), the silicon oxide film 210 is formed around the Si semiconductor film 202, here, on the top face and side face by heat treatment in an oxygen atmosphere. Ion-implanted S is aggregated (piled up) on the exposed surface (interface between Si and $SiO_2$) of each of the Si semiconductor films 202 by the heat treatment to terminate dangling bonds of Si in the interface with the silicon oxide film 210. As a result, as described above, oxidation can be stopped during oxidation. Process content is the same as that in the first embodiment. Each subsequent process is the same as that in the first embodiment.

By undergoing the above processes, an Si nano-wire in which an nMOS structure and a pMOS structure are alternately arranged can be formed.

According to the third embodiment, as described above, like in the first embodiment, effects of suppressing mobility deterioration and suppressing variations in threshold voltage can be gained for MOSFET other than the NAND-type memory.

The embodiments are described above with reference to the concrete examples. However, the embodiments are not limited to the concrete examples.

The thickness, size, shape, and number of layers (films) can appropriately be selected and used for what is needed in semiconductor integrated circuits and various semiconductor elements.

In addition, all methods for fabricating a semiconductor device which include the elements of the embodiments and can be obtained by arbitrary change of design by a person skilled in the art are included in the spirit and scope of the embodiments.

For the sake of simplifying the description, techniques commonly used in semiconductor industry, for example, the photolithography process and cleaning before/after treatment are omitted, but such techniques are naturally included in the spirit and scope of the embodiments.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
a plurality of silicon (Si) semiconductor parts arranged on a substrate, formed in a wire-shaped structure, and in which at least one element of sulfur (S), selenium (Se), and tellurium (Te) is present on a surface portion; and
a plurality of dielectric films respectively formed as if to cover a corresponding Si semiconductor part of the plurality of Si semiconductor parts and in contact with a surface portion of the corresponding Si semiconductor part of the plurality of Si semiconductor parts to form an interface with the corresponding Si semiconductor part of the plurality of Si semiconductor parts,
wherein the plurality of Si semiconductor parts is arranged in a vertical direction with respect to a substrate surface; and further comprising:
a plurality of charge accumulation films respectively formed as if to cover a corresponding dielectric film of the plurality of dielectric films;
a plurality of interelectrode dielectric films respectively formed as if to cover a corresponding charge accumulation film of the plurality of charge accumulation films; and
a control electrode formed as if to cover the plurality of interelectrode dielectric films.

2. The semiconductor device according to claim 1, wherein the element has a surface density in the interface of $1 \times 10^9$ $cm^{-2}$ or more and $7 \times 10^{14}$ $cm^{-2}$ or less.

3. The device according to claim 1, wherein the plurality of Si semiconductor parts is further arranged in a horizontal direction with respect to a substrate surface, further comprising:
a plurality of charge accumulation films respectively formed as if to cover a corresponding dielectric film of the plurality of dielectric films and arranged in the horizontal direction;
a plurality of interelectrode dielectric films respectively formed as if to cover a corresponding charge accumulation film of the plurality of charge accumulation films and arranged in the horizontal direction; and
a plurality of control electrodes respectively formed as if to cover a corresponding interelectrode dielectric film of the plurality of interelectrode dielectric films and arranged in the horizontal direction.

4. The semiconductor device according to claim 1, wherein a top face of the wire-shaped structure has a (001) orientation and a side face thereof has a (100) orientation.

5. The semiconductor device according to claim 1, wherein the semiconductor device includes an NAND-type memory device.

6. The semiconductor device according to claim 1, wherein the plurality of dielectric films are formed by using one of oxide, nitride and oxynitride.

7. The semiconductor device according to claim 1, wherein the plurality of dielectric films are respectively used as a tunnel dielectric film.

* * * * *